(12) United States Patent
Hayashi et al.

(10) Patent No.: US 8,822,814 B2
(45) Date of Patent: Sep. 2, 2014

(54) COMPOSITION FOR ELECTRODE FORMATION AND METHOD FOR FORMING ELECTRODE BY USING THE COMPOSITION

(75) Inventors: Toshiharu Hayashi, Naka-gun (JP); Kazuhiko Yamasaki, Naka-gun (JP); Yoshiaki Takata, Iwaki (JP)

(73) Assignee: Mitsubishi Materials Corporation, Tokyo (JP)

( * ) Notice: Subject to any disclaimer, the term of this patent is extended or adjusted under 35 U.S.C. 154(b) by 7 days.

(21) Appl. No.: 12/444,720

(22) PCT Filed: Oct. 10, 2007

(86) PCT No.: PCT/JP2007/069750
§ 371 (c)(1),
(2), (4) Date: Apr. 8, 2009

(87) PCT Pub. No.: WO2008/047641
PCT Pub. Date: Apr. 24, 2008

(65) Prior Publication Data
US 2010/0096002 A1    Apr. 22, 2010

(30) Foreign Application Priority Data

Oct. 11, 2006 (JP) ................. 2006-277228
Feb. 16, 2007 (JP) ................. 2007-035650
Oct. 2, 2007 (JP) ................. 2007-258311

(51) Int. Cl.
*H01L 31/0224* (2006.01)
(52) U.S. Cl.
USPC ......... 136/256; 136/255; 136/252; 252/501.1

(58) Field of Classification Search
USPC ................. 136/256, 255, 252; 252/501.1
See application file for complete search history.

(56) References Cited

U.S. PATENT DOCUMENTS

| | | | |
|---|---|---|---|
| 5,136,351 A | 8/1992 | Inoue et al. | |
| 5,282,902 A | 2/1994 | Matsuyama et al. | |
| 5,378,408 A * | 1/1995 | Carroll et al. | 252/514 |
| 5,957,828 A | 9/1999 | Hayashi | |
| 6,071,437 A | 6/2000 | Oya | |
| 6,086,790 A | 7/2000 | Hayashi et al. | |
| 6,117,366 A | 9/2000 | Park et al. | |
| 6,136,228 A | 10/2000 | Hirai et al. | |
| 6,366,333 B1 | 4/2002 | Yamamoto et al. | |
| 6,451,433 B1 * | 9/2002 | Oka et al. | 428/432 |
| 7,940,447 B2 | 5/2011 | Wu et al. | |

(Continued)

FOREIGN PATENT DOCUMENTS

| | | |
|---|---|---|
| EP | 1775734 A2 | 4/2007 |
| JP | 63-213974 A | 9/1988 |

(Continued)

OTHER PUBLICATIONS

US Office Action mailed Jul. 7, 2011 for the related U.S. Appl. No. 12/306,884.

(Continued)

*Primary Examiner* — Golam Mowla
(74) *Attorney, Agent, or Firm* — Leason Ellis LLP.

(57) ABSTRACT

A composition for electrode formation containing metal nanoparticles dispersed in a dispersion medium, wherein the composition also comprises one or more organic polymers selected from the group consisting of polyvinylpyrrolidones, polyvinylpyrrolidone copolymers, polyvinyl alcohols, and cellulose ethers.

10 Claims, 6 Drawing Sheets

(56) References Cited

U.S. PATENT DOCUMENTS

| | | | |
|---|---|---|---|
| 2004/0046154 A1* | 3/2004 | McVicker et al. ............ 252/512 | |
| 2004/0259007 A1 | 12/2004 | Takahashi et al. | |
| 2005/0116203 A1 | 6/2005 | Takahashi et al. | |
| 2006/0073667 A1 | 4/2006 | Li et al. | |
| 2006/0231801 A1 | 10/2006 | Carroll et al. | |
| 2008/0063874 A1 | 3/2008 | Rakow et al. | |
| 2008/0134936 A1 | 6/2008 | Kamikoriyama et al. | |
| 2009/0053469 A1 | 2/2009 | Sato et al. | |
| 2009/0250106 A1 | 10/2009 | Hayashi et al. | |
| 2010/0096002 A1 | 4/2010 | Hayashi et al. | |
| 2013/0099179 A1 | 4/2013 | Vanheusden et al. | |

FOREIGN PATENT DOCUMENTS

| | | |
|---|---|---|
| JP | 64-054768 A | 3/1989 |
| JP | 02-007476 A | 1/1990 |
| JP | 03-099477 A | 4/1991 |
| JP | 03-099478 A | 4/1991 |
| JP | 4-218977 A | 8/1992 |
| JP | 04-334069 A | 11/1992 |
| JP | 05-095127 A | 4/1993 |
| JP | 06-196728 A | 7/1994 |
| JP | 06-300907 A | 10/1994 |
| JP | 07-106617 A | 4/1995 |
| JP | 07-330337 A | 12/1995 |
| JP | 09-115438 A | 5/1997 |
| JP | 09-246577 A | 9/1997 |
| JP | 10-001777 A | 1/1998 |
| JP | 10-066861 | 3/1998 |
| JP | 10-73704 A | 3/1998 |
| JP | 10-188681 A | 7/1998 |
| JP | 10-326522 | 12/1998 |
| JP | 11-045619 | 2/1999 |
| JP | 11-329070 | 11/1999 |
| JP | 2000-090737 | 3/2000 |
| JP | 2000-239853 A | 9/2000 |
| JP | 2001-313400 | 11/2001 |
| JP | 2001-325831 | 11/2001 |
| JP | 2002-025942 A | 1/2002 |
| JP | 3287754 | 3/2002 |
| JP | 2002-198547 A | 7/2002 |
| JP | 2002-237214 A | 8/2002 |
| JP | 2003-132734 A | 5/2003 |
| JP | 2003-179241 A | 6/2003 |
| JP | 2003-273041 A | 9/2003 |
| JP | 2004-006263 A | 1/2004 |
| JP | 2004-143325 | 5/2004 |
| JP | 2004-143571 A | 5/2004 |
| JP | 2004-182487 A | 7/2004 |
| JP | 2004-182812 A | 7/2004 |
| JP | 2004-296801 A | 10/2004 |
| JP | 2005-002387 A | 1/2005 |
| JP | 2005-015647 A | 1/2005 |
| JP | 2005-504409 | 2/2005 |
| JP | 2005-191107 A | 7/2005 |
| JP | 2005-243500 | 9/2005 |
| JP | 2005-268547 A | 9/2005 |
| JP | 2005-353904 A | 12/2005 |
| JP | 2006-193594 A | 7/2006 |
| JP | 2006-210301 A | 8/2006 |
| TW | 200510493 | 3/2005 |
| TW | I 229108 | 3/2005 |
| TW | 200622454 A | 7/2006 |
| WO | WO 03025954 | 3/2003 |
| WO | WO 03085052 | 10/2003 |
| WO | WO-2006/061557 A1 | 6/2006 |
| WO | WO-2006/070747 A1 | 7/2006 |
| WO | WO-2006/076611 A2 | 7/2006 |
| WO | WO-2006/109799 A | 10/2006 |
| WO | WO-2007/080997 | 7/2007 |

OTHER PUBLICATIONS

Office Action of the corresponding Japanese Application No. 2006-305409 mailed May 8, 2012.

Decision of Rejection of the corresponding Japanese Application No. 2006-307307 mailed May 8, 2012.

Office Action mailed Apr. 2, 2013 for the related U.S. Appl. No. 13/572,360.

Yanagida et al., Frontier developments of thin film solar cells—towards higher efficiency, large scale production, and widespread promotion, Mar. 10, 2005, pp. 112-115, NTS Corporation (partial English translation provided).

European Search Report mailed on Dec. 27, 2010 for the corresponding European application No. 0870650.0.

Japanese Office Action Application No. 2008-095008 mailed Aug. 28, 2012.

Official Inquiry mailed Nov. 27, 2012 for the corresponding. Japanese Patent Application No. 2006-307307.

Office Action mailed Dec. 6, 2012 for the corresponding Taiwanese Patent Application No. 096109518.

Office Action mailed Feb. 25, 2013 for the corresponding Taiwanese Patent Application No. 096138019.

Office Action mailed Apr. 2, 2013 for the related U.S. Appl. No 13/572,360.

Office Action mailed Aug. 13, 2013 for the related Japanese Patent Application No. 2012-229394.

Office Action mailed Sep. 17, 2013 for the related Japanese Patent Application No. 2012-08349.

Office Action mailed Oct. 8, 2013 for the related Japanese Patent Application No. 2012-160131.

Appeal Decision mailed Apr. 2, 2013 for the related Japanese Application No. 2006-307307.

Notice of Allowance mailed Jun. 4, 2013 for the related Japanese Application No. 2006-305508.

Office Action mailed Jun. 6, 2013 for the related U.S. Appl. No. 12/306,884.

Office Action mailed Jul. 22, 2013 for the related U.S. Appl. No. 13/572,360.

Notice of Allowance mailed Nov. 12, 2013 for the related Japanese Patent Application 2012-083491.

Office Action mailed May 1, 2014 for the related U.S. Appl. No. 13/572,360.

Office Action mailed Apr. 30, 2014 for the related Japanese Application No. 2013-013983 (previously submitted on May 12, 2014).

* cited by examiner

COMPOSITION FOR ELECTRODE FORMATION AND METHOD FOR FORMING ELECTRODE BY USING THE COMPOSITION

CROSS-REFERENCE TO RELATED PATENT APPLICATIONS

This is a U.S. National Phase Application under 35 U.S.C. §371 of International Patent Application No. PCT/JP2007/069750, filed Oct. 10, 2010, and claims the priority of Japanese Patent Application Nos. 2006-277228, filed Oct. 11, 2006, 2007-258311, filed Oct. 2, 2007, and 2007-035650, filed Feb. 16, 2007, all of which are incorporated by reference herein.

TECHNICAL FIELD

The present invention relates to a composition for electrode formation, a method for forming an electrode using the composition, an electrode for a solar cell and an electrode for an electronic paper electrode obtained using the method, and a solar cell and an electronic paper.

Priority is claimed on Japanese Patent Application No. 2006-277228, filed Oct. 11, 2006, Japanese Patent Application No. 2007-35650, filed Feb. 16, 2007, and Japanese Patent Application No. 2007-258311, filed Oct. 2, 2007, the contents of which are incorporated herein by reference.

BACKGROUND ART

Nowadays, for reasons of environmental conservation, research and development of clean energy is being vigorously pursued. Among such energy sources, solar cells are attracting considerable attention due to the limitless nature of the sunlight that acts as the resource, and the fact that the sunlight is non-polluting. Conventionally, electric power generation from sunlight using solar cells has often used monocrystalline or polycrystalline silicon. However, with these silicon materials used in solar cells, because a great deal of energy and time is required for crystal growth, and complex steps are also required in the subsequent production process, improving the mass production efficiency is difficult, and providing a low-cost solar cell is problematic.

In contrast, so-called thin-film semiconductor solar cells (hereafter referred to as thin-film solar cells) that use a semiconductor such as amorphous silicon can be produced by forming the required quantity of a semiconductor layer that functions as the photovoltaic layer on top of a low-cost substrate such as glass or stainless steel. Accordingly, it is thought that because these thin-film solar cells are thin and lightweight, cheap to produce, and easily produced with large surface areas, they are likely to become the predominant type of solar cell.

However, thin-film solar cells have a lower conversion efficiency than solar cells that use crystalline silicon, and have therefore not yet become widely used. As a result, a variety of innovations are currently being used to improve the performance of thin-film solar cells.

One of these innovations involves improving the light reflection properties from the back surface of the photovoltaic layer, namely, from the back electrode of the thin-film solar cell, which represents one of the potential fields of application for the present invention. This enables sunlight that has not been absorbed by the photovoltaic layer to be reflected back into the photovoltaic layer, meaning sunlight that has conventionally not been absorbed can be used more effectively.

Of the various possibilities, in order to enable the photovoltaic layer to efficiently absorb light from the low-energy, long wavelength region, the formation of a surface structure having unevenness with dimensions of several tens of nanometers to several microns, a so-called textured structure, on the back electrode has proven extremely effective. Light that has not been absorbed by the photovoltaic layer and reaches the back electrode is subjected to scattered reflection at the back electrode having this textured structure, and re-enters the photovoltaic layer in a changed direction. This light scattering lengthens the light path, and by ensuring total reflection conditions, ensures that the light is effectively confined within the solar cell. This effect, which is known as the "optical confinement effect", promotes light absorption within the photovoltaic layer, thereby improving the conversion efficiency of the solar cell. This optical confinement effect has become an essential technique in improving the conversion efficiency of solar cells.

As illustrated in FIG. 5, in a super straight-type solar cell 110 in which light enters from the side of a transparent substrate, the solar cell usually adopts a structure in which a transparent electrode 112, a photovoltaic layer 113 consisting of an amorphous Si layer 113a and a microcrystalline Si layer 113b, and a back electrode 115 are formed in sequence on a substrate 111. In order to achieve light scattering and the optical confinement effect, a textured structure 112a is generally formed on the light incident-side transparent electrode 112, which is a material such as $SnO_2$ for example, and the optical confinement effect is realized by generating light scattering at this textured structure. In this super straight-type solar cell, in order to achieve surface passivation of the photovoltaic layer 113, ohmic contact with the back electrode 115, and an optical design having increased reflectance, a transparent conductive film 114 is formed between the photovoltaic layer 113 and the back electrode 115.

On the other hand, as illustrated in FIG. 6, in the case of a substrate-type solar cell 120 in which light enters from the surface of a photovoltaic layer, the solar cell usually adopts a structure in which a back electrode 122, a photovoltaic layer 123 consisting of an amorphous Si layer 123a and a microcrystalline Si layer 123b, and a transparent electrode 124 are formed in sequence on a substrate 121. A textured structure 122a is generally formed on the back electrode 122 to generate light scattering, thereby realizing the optical confinement effect.

Examples of methods that have been proposed for forming the back electrode having a textured structure within this type of substrate-type solar cell include: methods in which a metal film is converted to a polycrystalline form by conducting heating during vapor deposition (for example, see Patent Document 1), methods in which sputter etching is conducted following vapor deposition and heat treatment of the metal electrode (for example, see Patent Document 2), methods in which localized silver aggregation is promoted by conducting heating during vapor deposition, thereby forming a semicontinuous film having surface texture, and then conducting a vapor deposition of silver at low temperature to form a continuous film (for example, se Patent Document 3), methods in which a textured film is formed by vapor deposition of an alloy such as Al—Si while the substrate is subjected to heating, and a metal film having a high reflectance is then formed by vapor deposition on top of the textured film (for example, see Patent Document 4), and methods in which a textured film is formed by vapor deposition of a Ag—Al alloy (for example, see Patent Document 5).

Patent Document 1: Japanese Unexamined Patent Application, First Publication No. Hei 03-99477 (page 6 upper left column line 19 to page 6 upper right column line 3)

Patent Document 2: Japanese Unexamined Patent Application, First Publication No. Hei 03-99478 (Claim 1))

Patent Document 3: Japanese Unexamined Patent Application, First Publication No. Hei 04-218977 (Claim 2, paragraphs [0019] to [0020], and FIG. 1)

Patent Document 4: Japanese Unexamined Patent Application, First Publication No. Hei 04-334069 (paragraph [0014])

Patent Document 5: Japanese Unexamined Patent Application, First Publication No. 2005-2387 (paragraph [0062])

DISCLOSURE OF INVENTION

Problems to be Solved by the Invention

However, in conventional methods for forming a back electrode having a textured structure within a super straight-type solar cell, vacuum deposition forms the basis of the method, and because a vacuum process is necessary, considerable problems arise in terms of process constraints and the running costs and the like associated with the production equipment. Methods for forming the back electrode 115 by applying and then calcining a conductive paste are also being investigated. However, conventionally known conductive pastes are typically silver pastes obtained by mixing flake-like silver particles with a binder such as an acrylic resin, vinyl acetate resin, epoxy resin or polyester resin, a solvent, a curing agent, and a catalyst and the like. However, although coatings obtained using this type of general conductive paste exhibit favorable adhesion to substrates, a problem arises in that their resistivity (volume resistivity) is typically in the order of $10^{-4}$ to $10^{-5}$ $\Omega\cdot cm$, which is 10 to 100 times the resistivity of metallic silver ($1.6\times10^{-6}$ $\Omega\cdot cm$), meaning a satisfactory degree of conductivity is unobtainable. Furthermore, there is also a possibility that spaces (voids) such as an air layer may be formed at the interface between the transparent conductive film 114 and the back electrode 115. If these types of spaces are formed at the interface between the transparent conductive film 114 and the back electrode 115, then the light reaching the spaces may become confined within the spaces, and light attenuation caused by scattering and light absorption by the metal may occur, resulting in an absorption loss, mainly for light of 600 nm or more, that leads to a marked reduction in the conversion efficiency.

Furthermore, in conventional methods for forming a back electrode having a textured structure within a substrate-type solar cell, the type of vacuum deposition method disclosed in Patent Documents 1 to 5 forms the basis of the method. As a result, because a vacuum process is necessary, considerable problems arise in terms of process constraints and the running costs and the like associated with the production equipment.

Furthermore, in recent years, much research and development has been conducted in relation to electronic papers, which are attracting considerable expectation as next-generation display devices. The term "electronic paper" is a generic term used to describe display devices having the added functionality of handling properties similar to those of paper. As illustrated in FIG. 7, electronic papers having a structure in which an active layer 133 is formed on a substrate 131 with a transparent electrode film 132 disposed therebetween, and an electrode layer 134 is then joined at the interface with the active layer 133 are already known.

However, in those cases where the electrode layer 134 is formed on the surface of the active layer 133 using a conductive paste such as a conventional silver paste, a problem arises in that during the calcination conducted during the sintering process, irregularities (spaces) tend to be generated at the bonding interface between the active layer 133 and the electrode layer 134. As a result, in conductive layers formed using a conventional conductive paste, these generated irregularities tend to cause electric field concentration, which results in different activity within those regions in which electric field concentration occurs and those regions in which electric field concentration does not occur, making the structure unsuitable as an electronic paper.

An object of the present invention is to provide a composition which is ideal for forming an electrode, which does not require a vacuum process during deposition for forming the back electrode of a super straight-type solar cell, and which can be controlled so as not to form spaces such as a fine air layer at the bonding interface between the transparent electrode film and the back electrode, and also to provide a method for forming an electrode that uses this composition, and a solar cell electrode and a solar cell obtained using the method.

Another object of the present invention is to provide a composition which is ideal for forming an electrode, which does not require a vacuum process during deposition for forming the back electrode of a substrate-type solar cell, which is capable of forming a favorable textured structure, and for which the average surface roughness and the shape of the textured surface can be controlled, and also to provide a method for forming an electrode that uses this composition, and a solar cell electrode and a solar cell obtained using the method.

Yet another object of the present invention is to provide a composition for electrode formation that is capable of forming a smooth bonding interface with the active layer when forming an electrode layer for an electronic paper, and also to provide a method for forming an electrode that uses this composition, and an electronic paper electrode and an electronic paper obtained using the method.

Yet another object of the present invention is to provide a composition for electrode formation, which has a reflectance that is close to the reflectance of the metal itself that constitutes the metal nanoparticles contained within the composition, and a resistivity that is close to the resistivity of the metal itself that constitutes the metal nanoparticles contained within the composition, and is capable of forming an electrode that exhibits excellent adhesion, and also to provide a method for forming an electrode that uses this composition.

Means to Solve the Problems

A first aspect of the present invention is a composition for electrode formation that includes metal nanoparticles dispersed in a dispersion medium, wherein the composition also includes one or more organic polymers selected from the group consisting of polyvinylpyrrolidones (hereafter abbreviated as PVP), PVP copolymers, polyvinyl alcohols (hereafter abbreviated as PVA), and cellulose ethers.

The quantity of the organic polymer may be within a range from 0.1 to 20% by weight of the metal nanoparticles.

The metal nanoparticles may include 75% by weight or more of silver nanoparticles.

The metal nanoparticles may be chemically modified with a protective agent having an organic molecular main chain in which the carbon skeleton contains from 1 to 3 carbon atoms.

The metal nanoparticles may include a numerical average of at least 70% of metal nanoparticles having a primary particle size within a range from 10 to 50 nm.

The metal nanoparticles may include at least 75% by weight of silver nanoparticles, and also include particles composed of one metal, or a mixed composition or alloy composition of two or more metals, selected from the group consisting of gold, platinum, palladium, ruthenium, nickel, copper, tin, indium, zinc, iron, chromium and manganese, and the quantity of particles other than the silver nanoparticles contained within the metal nanoparticles may be at least 0.02% by weight but less than 25% by weight.

The dispersion medium may be an alcohol or an alcohol-containing aqueous solution.

The composition for electrode formation may further include one or more additives selected from the group consisting of metal oxides, metal hydroxides, organometallic compounds and silicone oils.

The metal oxide may be an oxide or a composite oxide containing at least one element selected from the group consisting of aluminum, silicon, titanium, chromium, manganese, iron, cobalt, nickel, silver, copper, zinc, molybdenum, tin, indium and antimony.

The metal hydroxide may be a hydroxide containing at least one element selected from the group consisting of aluminum, silicon, titanium, chromium, manganese, iron, cobalt, nickel, silver, copper, zinc, molybdenum, tin, indium and antimony.

The organometallic compound may be a metal soap, a metal complex or a metal alkoxide of silicon, titanium, chromium, manganese, iron, cobalt, nickel, silver, copper, zinc, molybdenum or tin.

A second aspect of the present invention is a method for forming an electrode that includes: forming a film by applying any of the above compositions for electrode formation to a substrate using a wet coating method, and calcining the substrate with the film formed on the upper surface thereof at a temperature of 130 to 400° C.

The thickness, following calcination, of the electrode formed on the upper surface of the substrate may be within a range from 0.1 to 2.0 μm.

The average surface roughness of the electrode formed on the upper surface of the substrate may be within a range from 10 to 100 nm.

The substrate may be either a substrate composed of silicon, glass, a ceramic containing a transparent conductive material, a polymer material or a metal, or a laminate composed of two or more materials selected from the group consisting of silicon, glass, ceramics containing a transparent conductive material, polymer materials and metals.

The substrate may be either a solar cell element or a solar cell element with an attached transparent electrode.

The wet coating method described above may be any one of a spray coating method, dispenser coating method, spin coating method, knife coating method, slit coating method, inkjet coating method, screen printing method, offset printing method or die coating method.

A third aspect of the present invention is a solar cell electrode obtained using any of the methods for forming an electrode described above.

A fourth aspect of the present invention is an electronic paper electrode obtained using any of the methods for forming an electrode described above.

The solar cell electrode may be the back electrode of a solar cell that includes at least a substrate, a back electrode, a photovoltaic layer and a transparent electrode, wherein the solar cell has a substrate-type structure in which the substrate, the back electrode, the photovoltaic layer and the transparent electrode are formed in that order.

The solar cell electrode may also be the back electrode of a solar cell that includes at least a substrate, a transparent electrode, a photovoltaic layer and a back electrode, wherein the solar cell has a super straight-type structure in which the substrate, the transparent electrode, the photovoltaic layer and the back electrode are formed in that order.

A fifth aspect of the present invention is a solar cell that includes any of the solar cell electrodes described above.

A sixth aspect of the present invention is an electronic paper that includes any of the electronic paper electrodes described above.

Effect of the Invention

The composition for electrode formation according to the present invention does not require a vacuum process during the deposition for forming the back electrode of a super straight-type solar cell, and can be controlled so as not to form spaces such as a fine air layer at the bonding interface between the transparent electrode film and the back electrode. Further, the composition does not require a vacuum process during the deposition for forming the back electrode of a substrate-type solar cell, is capable of forming a favorable textured structure, and is also capable of controlling the average surface roughness and the shape of the textured surface. Furthermore, the composition is capable of forming a smooth bonding interface with the active layer when forming an electrode layer for an electronic paper. Moreover, the composition has a reflectance that is close to the reflectance of the metal itself that constitutes the metal nanoparticles contained within the composition, and a resistivity that is close to the resistivity of the metal itself that constitutes the metal nanoparticles contained within the composition, and is capable of forming an electrode that exhibits excellent adhesion.

DESCRIPTION OF THE REFERENCE SYMBOLS

Figure 1A:
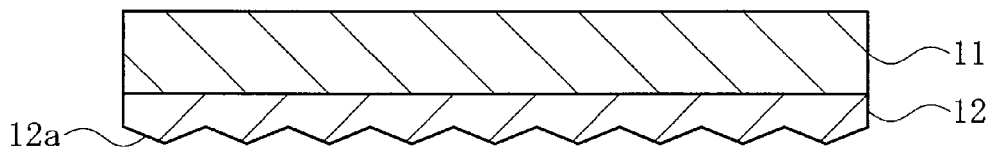
FIG. 1A is a cross-sectional view illustrating an embodiment of a production process for a super straight-type solar cell according to the present invention.

| | |
|---|---|
| 10 | Super straight-type solar cell |
| 11 | Substrate |
| 12 | Transparent electrode |
| 12a | Textured structure |
| 13 | Photovoltaic layer |
| 13a | Amorphous Si |
| 13b | Microcrystalline Si |
| 14 | Transparent conductive film |
| 15 | Back electrode |
| 20 | Substrate-type solar cell |
| 21 | Substrate |
| 22 | Back electrode |
| 22a | Textured structure |
| 23 | Photovoltaic layer |
| 23a | Amorphous Si |
| 23b | Microcrystalline Si |
| 24 | Transparent electrode |
| 25 | Sealant |
| 30 | Electronic paper |
| 31 | Substrate |
| 32 | Transparent conductive film |
| 33 | Active layer |
| 34 | Electrode layer |

BEST MODE FOR CARRYING OUT THE INVENTION

A description of the best mode for carrying out the present invention is presented below.

A composition for electrode formation according to the present invention is a composition that contains metal nanoparticles dispersed in a dispersion medium. The composition of the present invention also includes one or more organic polymers selected from the group consisting of PVP, PVP copolymers, PVA, and cellulose ethers. By including, within the composition, a predetermined proportion of one or more organic polymers selected from the above group of organic polymers containing nitrogen or oxygen, if a back electrode for a super straight-type solar cell is formed using the composition, then particle growth caused by sintering of the metal nanoparticles can be controlled. If this control is exercised in a direction that inhibits particle growth, then no texture is generated on the back electrode-side of the bonding interface between the transparent conductive film and the back electrode, meaning spaces such as air layers can be prevented from forming.

Furthermore, if a back electrode for a substrate-type solar cell is formed using the composition, then because an effect is realized that suppresses particle growth caused by sintering of the metal nanoparticles, an electrode having a favorable textured structure can be formed. In this case, the average surface roughness and the shape of the textured structure can be controlled. An electrode formed using this composition exhibits excellent adhesion to substrates.

The formation of an electrode using the composition of the present invention does not require a vacuum process during deposition, and therefore process constraints are minimal, and running costs associated with the production equipment can be reduced dramatically.

Furthermore, if an electrode layer for an electronic paper is formed using this composition, then particle growth caused by sintering of the metal nanoparticles can be controlled. If this control is exercised in a direction that inhibits particle growth, then the bonding interface with the active layer can be smoothed.

Moreover, if an electrode is formed using this composition, then an electrode can be obtained which, although not exhibiting adhesion as favorable as that obtained when a typical binder such as a conventional epoxy resin or urethane resin is added, exhibits a level of adhesion that is satisfactory for practical purposes, and has a reflectance that is close to the reflectance of the metal itself that constitutes the metal nanoparticles contained within the composition, and a resistivity that is close to the resistivity of the metal itself that constitutes the metal nanoparticles contained within the composition.

For example, if an organic polymer having a heterocycle such as PVP is added to the composition, then an effect is realized that enables a reduction in the surface roughness of a coating formed using the composition. As a result, by adjusting the proportion of the above organic polymer added to the composition, a coating surface with the desired level of surface roughness can be obtained. The quantity of the organic polymer is selected within a range from 0.1 to 20% by weight of the metal nanoparticles. Within this range, the quantity of the organic polymer is usually more preferably within a range from 0.2 to 10% by weight, although this is dependent on the nature of the organic polymer used. The reason for setting the quantity of the organic polymer to a value within a range from 0.1 to 20% by weight of the metal nanoparticles is because at quantities of less than 0.1% by weight, the sintering suppression effect cannot be obtained, and the adhesion between the formed film and the substrate tends to be unsatisfactory, whereas if the quantity exceeds 20% by weight, then the resistivity and the reflectance tend to deteriorate. Specific examples of the PVP copolymers include PVP-methacrylate copolymers, PVP-styrene copolymers, and PVP-vinyl acetate copolymers. Furthermore, examples of the cellulose ethers include hydroxypropylmethylcellulose, methylcellulose, and hydroxyethylmethylcellulose.

If an electrode is formed using a composition that does not include the organic polymer such as PVP described above, then the surface roughness of the formed electrode increases. However, there are specific conditions for the textured shape of the electrode surface in terms of optimizing the conversion efficiency, and simply increasing the surface roughness does not enable the formation of an electrode surface having excellent photovoltaic conversion efficiency. By altering the nature and concentration and the like of the PVP or the like, as in the composition of the present invention, a surface having optimal surface roughness can be formed.

The above metal nanoparticles may contain 75% by weight or more, and preferably 80% by weight or more, of silver nanoparticles. The reason for specifying a range of 75% by weight or more for the quantity of silver metal nanoparticles within the total 100% by weight of all the metal nanoparticles is because if this quantity is less than 75% by weight, then the reflectance of an electrode formed using the composition tends to decrease.

The metal nanoparticles are preferably chemically modified with a protective agent having an organic molecular main chain in which the carbon skeleton contains from 1 to 3 carbon atoms. The reason for this preference is that when calcination is performed following application of the composition to a substrate, the organic molecules within the protective agent protecting the surface of the metal nanoparticles are eliminated or decomposed, or are detached and decomposed, meaning an electrode is obtained in which the main component is a metal containing essentially no organic residues likely to have an adverse effect on the electrode conductivity and reflectance. The reason for setting the number of carbon atoms for the carbon skeleton of the organic molecular main chain of the protective agent used for chemically modifying the metal nanoparticles to a number within a range from 1 to 3 is because if the number of carbon atoms is 4 or greater, then elimination or decomposition (separation and combustion) of the protective agent under the heat used during calcination becomes difficult, and a large quantity of organic residues that may have an adverse effect on the electrode conductivity and reflectance tends to be retained within the electrode.

Moreover, the protective agent, namely the protective agent used for chemically modifying the surface of the metal nanoparticles, contains either one or both of a hydroxyl group (—OH) and a carbonyl group (—C═O). If a hydroxyl group (—OH) is included within the protective agent used for chemically modifying the metal nanoparticles such as silver nanoparticles, then the resulting composition exhibits excellent dispersion stability, and there is also a favorable effect on low-temperature sintering of the coating. If a carbonyl group (—C═O) is included within the protective agent used for chemically modifying the metal nanoparticles such as silver nanoparticles, then in the same manner as described above, the resulting composition exhibits excellent dispersion stability, and a favorable effect on low-temperature sintering of the coating is also achieved.

The metal nanoparticles may include a numerical average of at least 70%, and preferably 75% or more, of metal nanoparticles having a primary particle size within a range from 10 to 50 nm. The reason for setting the quantity of metal nanoparticles having a primary particle size within a range from 10 to 50 nm to a numerical average of at least 70% relative to the total 100% of all the metal nanoparticles is because if this quantity is less than 70%, then the specific surface area of the metal nanoparticles increases, and the proportion of the particles composed of the protective agent increases, meaning that even if the protective agent is an organic molecule that readily undergoes elimination or decomposition (separation and combustion) under the heat used during calcination, because the proportion of the particles composed of these organic molecules is high, a large quantity of organic residues tends to be retained within the electrode. These residues tend to degenerate or decompose, causing reductions in the conductivity and reflectance of the electrode, or causing a broadening of the particle size distribution of the metal nanoparticles, which makes the electrode prone to a decrease in density, and results in reductions in the conductivity and reflectance of the electrode. Moreover, the reason for setting the range for the primary particle size for the metal nanoparticles to a range from 10 to 50 nm is because statistical analysis suggests that metal nanoparticles having a primary particle size within the range from 10 to 50 nm exhibit a positive correlation with the stability over time (long-term stability).

Furthermore, the metal nanoparticles preferably include at least 75% by weight of silver nanoparticles, and also include metal nanoparticles composed of one metal, or a mixed composition or alloy composition of two or more metals, selected from the group consisting of gold, platinum, palladium, ruthenium, nickel, copper, tin, indium, zinc, iron, chromium and manganese. The quantity of these metal nanoparticles other than the silver nanoparticles is preferably at least 0.02% by weight but less than 25% by weight, and more preferably from 0.03 to 20% by weight, relative to 100% by weight of all the metal nanoparticles. The reason for setting the quantity of these metal nanoparticles other than the silver nanoparticles to a quantity of at least 0.02% by weight but less than 25% by weight relative to 100% by weight of all the metal nanoparticles is because if the quantity is less than 0.02% by weight, then although not a significant problem, it was found that the conductivity and reflectance of the electrode following a weather resistance test (a test in which the electrode was held for 1,000 hours in a constant temperature, constant humidity chamber at a temperature of 100° C. and a humidity of 50%) was more likely to deteriorate compared with the conductivity and reflectance prior to the weather resistance test than in the case where the quantity was at least 0.02% by weight but less than 25% by weight. Further, at a quantity of 25% by weight or greater, the conductivity and reflectance of the electrode immediately following calcination tend to decrease, and the conductivity and reflectance for the electrode tend to be poorer following the weather resistance test than prior to the weather resistance test.

Furthermore, the composition may further include one or more additives selected from the group consisting of metal oxides, metal hydroxides, organometallic compounds and silicone oils. By including one or more of the above additives in the composition, a superior suppression effect can be achieved for particle growth caused by sintering of the metal nanoparticles, meaning a surface shape suited to the intended purpose can be more readily formed. The quantity added of the additive is preferably within a range from 0.1 to 20% by weight, relative to 100% by weight of the composition. Within this range, a quantity within a range from 1 to 5% by weight is particularly preferred. If the quantity added of the additive is less than the lower limit of the above range, then the particle growth suppression effect cannot be obtained, whereas if the quantity of the additive exceeds the upper limit of the above range, then a problem arises in that the resistivity increases dramatically. In the present invention, the term "metal oxide" includes not only oxides of metal elements, but also oxides of metalloid elements. Moreover, in the present invention, the term "metal hydroxide" includes not only hydroxides of metal elements, but also hydroxides of metalloid elements. Similarly, in the present invention, the term "organometallic compound" includes compounds containing not only metal elements, but also compounds containing metalloid elements.

If an electrode is formed using a composition that contains neither the organic polymers described above nor the types of additives described above, then the surface roughness of the formed electrode increases. However, there are specific conditions for the textured shape of the electrode surface in terms of optimizing the conversion efficiency, and simply increasing the surface roughness does not enable the formation of an electrode surface having excellent photovoltaic conversion efficiency. By altering the nature and concentration and the like of the organic polymers and the additives, as in the composition of the present invention, an optimal textured surface can be formed.

As the metal oxide that may be used as an additive, an oxide or a composite oxide containing at least one element selected from the group consisting of aluminum, silicon, titanium, chromium, manganese, iron, cobalt, nickel, silver, copper, zinc, molybdenum, tin, indium and antimony is preferred. Specific examples of the composite oxides include Indium Tin Oxide (ITO), Antimony Tin Oxide (ATO) and Indium Zinc oxide (IZO).

As the metal hydroxide that may be used as an additive, a hydroxide containing at least one element selected from the group consisting of aluminum, silicon, titanium, chromium, manganese, iron, cobalt, nickel, silver, copper, zinc, molybdenum, tin, indium and antimony is preferred.

As the organometallic compound that may be used as an additive, a metal soap, a metal complex or a metal alkoxide of silicon, titanium, chromium, manganese, iron, cobalt, nickel, silver, copper, zinc, molybdenum or tin is preferred. Examples of metal soaps include chromium acetate, manganese formate, iron citrate, cobalt formate, nickel acetate, silver citrate, copper acetate, copper citrate, tin acetate, zinc acetate, zinc oxalate and molybdenum acetate. Further, examples of metal complexes include zinc acetylacetonate, chromium acetylacetonate and nickel acetylacetonate. Furthermore, examples of metal alkoxides include titanium isopropoxide, methyl silicate, isocyanatopropylmethoxysilane and aminopropyltrimethoxysilane.

Examples of silicone oils that can be used as an additive include both straight silicone oils and modified silicone oils. As the modified silicone oils, oils that include organic groups introduced at a portion of the side chains of a polysiloxane (side-chain type oils), oils that include organic groups introduced at both terminals of a polysiloxane (both terminal-type oils), oils that include an organic group introduced at one of the two terminals of a polysiloxane (single terminal-type oils), and oils that include organic groups introduced at a portion of the side chains and at both terminals of a polysiloxane (side-chain, both terminal-type oils) can be used. Modified silicone oils include both reactive silicone oils and unreactive silicone oils, and a combination of both types may also be used as an additive in the present invention. Reactive silicone oils include amino-modified, epoxy-modified, carboxy-modified, carbinol-modified and mercapto-modified silicone oils, as well as silicone oils modified with a number of different functional groups (such as epoxy groups, amino groups and polyether groups). Unreactive silicone oils include polyether-modified, methylstyryl-modified, alkyl-modified, higher fatty acid ester-modified, fluorine-modified, and specific hydrophilic-modified silicone oils.

The quantity of the metal nanoparticles within the composition for electrode formation is preferably within a range from 2.5 to 95.0% by weight, and more preferably from 3.5 to 90.0% by weight, relative to 100% by weight of the dispersion composed of the metal nanoparticles and the dispersion medium. The reason for setting the quantity of the metal nanoparticles to a value within a range from 2.5 to 95.0% by weight relative to 100% by weight of the dispersion composed of the metal nanoparticles and the dispersion medium is because at a quantity of less than 2.5% by weight, although there are no effects on the properties of the electrode following calcination, forming an electrode of the required thickness becomes difficult, whereas if the quantity exceeds 95.0% by weight, then the ink-like or paste-like fluidity required during wet coating of the composition tends to be lost.

Furthermore, the dispersion medium used in forming the composition for electrode formation according to the present invention typically contains at least 1% by weight, and preferably 2% by weight or more of water, and at least 2% by weight, and preferably 3% by weight or more of an alcohol, relative to 100% by weight of the total dispersion medium. For example, in those cases where the dispersion medium is composed entirely of water and an alcohol, if the medium contains 2% by weight of water, then it includes 98% by weight of the alcohol, whereas if the medium contains 2% by weight of the alcohol, it contains 98% by weight of water. The reason that the quantity of water is preferably at least 1% by weight relative to 100% by weight of the total dispersion medium is because at a quantity of less than 1% by weight, the film obtained by applying the composition using a wet coating method tends to be difficult to sinter at low temperatures, and moreover the conductivity and reflectance of the electrode following calcination tend to decrease. The reason that the quantity of the alcohol is preferably at least 2% by weight relative to 100% by weight of the total dispersion medium is because at a quantity of less than 2% by weight, similar effects to those described above are obtained, wherein the film obtained by applying the composition using a wet coating method tends to be difficult to sinter at low temperatures, and moreover the conductivity and reflectance of the electrode following calcination tend to decrease. The alcohol used in the dispersion medium is preferably one or more alcohols selected from the group consisting of methanol, ethanol, propanol, butanol, ethylene glycol, propylene glycol, diethylene glycol, glycerol, isobornylhexanol and erythritol.

The alcohol is added to improve the wetting of the substrate, and the mixing proportions of water and alcohol can be altered freely in accordance with the type of substrate used.

A method for producing the above composition for electrode formation is described below.

(a) Cases Where the Carbon Skeleton of the Organic Molecular Main Chain of the Protective Agent Used for Chemically Modifying the Silver Nanoparticles Contains 3 Carbon Atoms First, a metal salt aqueous solution is prepared by dissolving silver nitrate in water such as deionized water. On the other hand, an aqueous solution of a reducing agent containing citrate ions and ferrous ions in a molar ratio of 3:2 is prepared by direct addition of particulate or powdered ferrous sulfate, within a stream of an inert gas such as nitrogen, to an aqueous solution of sodium citrate with a concentration of 10 to 40% obtained by dissolving sodium citrate in water such as deionized water. Subsequently, the aqueous solution of the reducing agent is subjected to constant stirring under the above inert gas stream, while the above metal salt aqueous solution is added dropwise to the aqueous solution of the reducing agent. The concentration levels of the respective solutions are preferably regulated so that the quantity added of the metal salt aqueous solution is not more than 1/10th of the quantity of the aqueous solution of the reducing agent, which enables the reaction temperature to be maintained within a range from 30 to 60° C. even if the metal salt aqueous solution is added at room temperature. Furthermore, the mixing ratio of the two aqueous solutions is preferably adjusted so that the molar ratios of the citrate ions and ferrous ions within the aqueous solution of the reducing agent relative to the total atomic valence of metal ions within the metal salt aqueous solution is a 3-fold molar ratio in each case. Following completion of the dropwise addition of the metal salt aqueous solution, stirring of the mixed solution is continued for 10 to 300 minutes, yielding a dispersion composed of a metal colloid. This dispersion is left to stand at room temperature, and the metal nanoparticle aggregates that precipitate out of the dispersion are isolated using either decantation or a centrifugal separation method. Subsequently, water such as deionized water is added to the isolated particles to form a dispersion, and a desalting treatment is conducted by ultrafiltration. Displacement washing is then conducted using an alcohol to achieve a metal (silver) content within a range from 2.5 to 50% by weight. Subsequently, by using a centrifuge and regulating the centrifugal force applied by the centrifuge, the coarse particles are separated, enabling the preparation of silver nanoparticles that include a numerical average of at least 70% of silver nanoparticles having a primary particle size within a range from 10 to 50 nm. In other words, the nanoparticles are prepared so that the proportion of silver nanoparticles having a primary particle size within a range from 10 to 50 nm, calculated as a numerical average relative to the total 100% of all the metal nanoparticles, is at least 70%. This enables a dispersion to be obtained in which the number of carbon atoms within the carbon skeleton of the organic molecular main chain of the protective agent used for chemically modifying the metal nanoparticles is 3.

Subsequently, the obtained dispersion is adjusted so that the final metal content (silver content) relative to 100% by weight of the dispersion is within a range from 2.5 to 95% by weight. Furthermore, if the dispersion medium is an alcohol-containing aqueous solution, then the water content and alcohol content within the medium are preferably adjusted to at least 1% and at least 2% respectively. Next, one or more organic polymers selected from the group consisting of PVP, PVP copolymers and cellulose ethers is added to the dispersion. The quantity of the organic polymer is adjusted to achieve a quantity within a range from 0.1 to 20% by weight of the metal nanoparticles. As a result, the metal nanoparticles that have been chemically modified with a protective agent having an organic molecular main chain in which the carbon skeleton contains 3 carbon atoms are dispersed within the dispersion medium, and a composition for electrode formation is obtained that includes one or more organic polymers selected from the group consisting of PVP, PVP copolymers and cellulose ethers. Further, the composition may also include one or more additives selected from the group consisting of metal oxides, metal hydroxides, organometallic compounds and silicone oils. In those cases where such an additive is included in the composition, the combined quantity of the organic polymer and the additive is adjusted so as to fall within a range from 0.1 to 20% by weight relative to 100% by weight of the resulting composition.

(b) Cases where the Carbon Skeleton of the Organic Molecular Main Chain of the Protective Agent Used for Chemically Modifying the Silver Nanoparticles Contains 2 Carbon Atoms With the exception of replacing the sodium citrate used in preparing the aqueous solution of the reducing agent with sodium malate, a dispersion is prepared in the same manner as (a) described above. This enables a dispersion to be obtained in which the number of carbon atoms within the carbon skeleton of the organic molecular main chain of the protective agent used for chemically modifying the metal nanoparticles is 2.

(c) Cases where the Carbon Skeleton of the Organic Molecular Main Chain of the Protective Agent Used for Chemically Modifying the Silver Nanoparticles Contains 1 Carbon Atom With the exception of replacing the sodium citrate used in preparing the aqueous solution of the reducing agent with sodium glycolate, a dispersion is prepared in the same manner as (a) described above. This enables a dispersion to be obtained in which the number of carbon atoms within the carbon skeleton of the organic molecular main chain of the protective agent used for chemically modifying the metal nanoparticles is 1.

(d) Cases Where the Carbon Skeleton of the Organic Molecular Main Chain of the Protective Agent Used for Chemically Modifying Metal Nanoparticles Other Than Silver Nanoparticles Contains 3 Carbon Atoms Examples of the metal that constitutes the metal nanoparticles other than silver nanoparticles include gold, platinum, palladium, ruthenium, nickel, copper, tin, indium, zinc, iron, chromium and manganese. With the exception of replacing the silver nitrate used in preparing the metal salt aqueous solution with chloroauric acid, chloroplatinic acid, palladium nitrate, ruthenium trichloride, nickel chloride, cuprous nitrate, tin dichloride, indium nitrate, zinc chloride, iron sulfate, chromium sulfate or manganese sulfate respectively, a dispersion is prepared in the same manner as (a) described above. This enables a dispersion to be obtained in which the number of carbon atoms within the carbon skeleton of the organic molecular main chain of the protective agent used for chemically modifying the metal nanoparticles other than silver nanoparticles is 3.

In those cases where the carbon skeleton of the organic molecular main chain of the protective agent used for chemically modifying the metal nanoparticles other than silver nanoparticles contains either 1 or 2 carbon atoms, then with the exception of replacing the silver nitrate used in preparing the metal salt aqueous solution with one of the metal salts described above, a dispersion is prepared in the same manner as the above-mentioned (b) or (c) respectively. This enables a dispersion to be obtained in which the number of carbon atoms within the carbon skeleton of the organic molecular main chain of the protective agent used for chemically modifying the metal nanoparticles other than silver nanoparticles is either 1 or 2.

In those cases where a combination of silver nanoparticles and metal nanoparticles other than silver nanoparticles are included in the composition as the metal nanoparticles, then for example, if a dispersion containing silver nanoparticles produced using the method (a) described above is termed "the first dispersion", and a dispersion containing metal nanoparticles other than silver nanoparticles produced using the method (d) described above is termed "the second dispersion", the composition can be obtained by mixing at least 75% by weight of the first dispersion with less than 25% by weight of the second dispersion so that the combined quantity of the first and second dispersions is 100% by weight. The first dispersion is not limited to a dispersion containing silver nanoparticles produced using the above method (a), and a dispersion containing silver nanoparticles produced using the method (b) described above, and/or a dispersion containing silver nanoparticles produced using the method (c) described above may also be used.

A method for forming an electrode using a composition for electrode formation produced in the manner described above is described below.

First, a film is formed by applying the above composition for electrode formation to a substrate using a wet coating method. The substrate may be either a substrate composed of silicon, glass, a ceramic containing a transparent conductive material, a polymer material or a metal, or a laminate composed of two or more materials selected from the group consisting of silicon, glass, ceramics containing a transparent conductive material, polymer materials and metals. Furthermore, a substrate containing at least one transparent conductive film, or a substrate having a transparent conductive film formed on the substrate surface may also be used. Examples of the transparent conductive film include indium oxide-based films, tin oxide-based films, and zinc oxide-based films. Examples of indium oxide-based films include indium oxide, ITO and IZO. Examples of tin oxide-based films include nesa (tin oxide $SnO_2$), ATO and fluorine-doped tin oxide. Examples of zinc oxide-based films include zinc oxide, AZO (aluminum-doped zinc oxide) and gallium-doped zinc oxide. The substrate is preferably either a solar cell element or a solar cell element with an attached transparent electrode. Examples of the transparent electrode include ITO, ATO, nesa, IZO and AZO. Moreover, a dielectric thin film such as lead zirconium titanate (PZT) may also be formed on the substrate surface. Examples of polymer substrates include substrates formed of an organic polymer such as a polyimide or PET (polyethylene terephthalate). The dispersion described above is applied to the surface of the photovoltaic semiconductor layer of a solar cell element, or to the transparent electrode of a solar cell element with an attached transparent electrode.

The wet coating method mentioned above is preferably one of a spray coating method, dispenser coating method, spin coating method, knife coating method, slit coating method, inkjet coating method, screen printing method, offset printing method or die coating method, although the present invention is not limited to these methods, and any appropriate method may be used.

Spray coating is a method in which the dispersion is applied to the substrate as a fine mist generated using compressed air, or in which the dispersion itself is pressurized and sprayed onto the substrate as a fine mist. Dispenser coating is a method in which, for example, the dispersion is placed inside an injector, and the dispersion is then discharged from a fine nozzle at the tip of the injector and applied to the substrate by depressing the injector piston.

Spin coating is a method in which the dispersion is dripped onto a spinning substrate, and the dripped dispersion spreads out to the peripheral edges of the substrate under centrifugal force. Knife coating is a method in which a substrate that is separated from the tip of a knife by a predetermined gap is provided in a manner that enables the substrate to be moved horizontally, and the dispersion is supplied onto the substrate at a point upstream from the knife, while the substrate is moved horizontally in the downstream direction.

Slit coating is a method in which the dispersion is exuded from a narrow slit and coated onto the substrate. Inkjet coating is a method in which the dispersion is used to fill the ink cartridge of a commercially available inkjet printer, and the dispersion is then applied to the substrate by inkjet printing.

Screen printing is a method in which a gauze is used as a patterning material, and the dispersion is transferred to the substrate through a print image formed on the gauze. Offset printing is a method that utilizes the water repellency of ink, wherein the dispersion applied to a plate is not adhered directly to the substrate, but is rather first transferred to a rubber sheet, before being subsequently transferred from the rubber sheet to the substrate.

Die coating is a method in which a dispersion that has been supplied to a die is distributed using a manifold, and is then extruded in a thin film from a slit, and applied to the surface of a moving substrate. Die coating methods include slot coating, slide coating and curtain coating methods.

Subsequently, the substrate having a film formed on the upper surface thereof is subjected to calcination, either under normal atmospheric conditions or in an inert gas atmosphere of nitrogen or argon or the like, at a temperature of 130 to 400° C., and preferably from 170 to 400° C., for a period of 5 minutes to one hour, and preferably 15 to 40 minutes. The reason that the calcination temperature for the film of the composition for electrode formation formed on the surface of the substrate is set to a temperature within a range from 130 to 400° C. is because at temperatures lower than 130° C., sintering of the metal nanoparticles is inadequate, and elimination or decomposition (separation and combustion) of the protective agent under the heat used during calcination becomes difficult, meaning a large quantity of organic residues tends to be retained within the electrode following calcination. These residues tend to degenerate or decompose, causing reductions in the conductivity and reflectance of the electrode. In contrast, raising the temperature above 400° C. results in a loss of the merit associated with conducting the production using a low-temperature process. In other words, the production costs increase, and the productivity tends to decrease. The effects are particularly pronounced on the photovoltaic conversion wavelength band for amorphous silicon, microcrystalline silicon, and hybrid silicon solar cells that use both these forms of silicon. Moreover, the reason that the calcination time for the film of the composition for electrode formation formed on the surface of the substrate is set to a period of 5 minutes to one hour is because at period of less than 5 minutes, sintering of the metal nanoparticles is inadequate, and elimination or decomposition (separation and combustion) of the protective agent under the heat used during calcination becomes difficult, meaning a large quantity of organic residues tends to be retained within the electrode following calcination. These residues tend to degenerate or decompose, causing reductions in the conductivity and reflectance of the electrode. Although lengthening the calcination time beyond one hour has no adverse effects on the properties, it results in an unnecessary increase in production costs and decrease in productivity.

Furthermore, the film formation process is controlled so that the thickness, following calcination, of the coating formed on the substrate surface is within a range from 0.1 to 2.0 μm, and preferably from 0.3 to 1.5 μm. The reason that the thickness, following calcination, of the coating of the composition for electrode formation formed on the substrate is set within a range from 0.1 to 2.0 μm is because at thickness values of less than 0.1 μm, the surface resistance for the electrode is inadequate for a solar cell. If the thickness exceeds 2.0 μm, then although there are no adverse effects on the properties, the quantities used of the various materials are considerably more than is necessary, resulting in material wastage.

Because the above composition for electrode formation includes a large quantity of comparatively large metal nanoparticles having an primary particle size of 10 to 50 nm, the specific surface area of the metal nanoparticles decreases, and the proportion of the particles constituted by the protective agent is reduced. As a result, when an electrode is formed using the composition, the protective agent is eliminated or decomposed, or detached and decomposed, by the heat applied during calcination, meaning an electrode is obtained that contains essentially no organic materials likely to have an adverse effect on the electrical conductivity.

By conducting calcination under the conditions described above, an electrode composed of a conductive coating can be formed on the substrate. The formed conductive coating exhibits excellent adhesion and forms no spaces such as a fine air layer at the bonding interface with the substrate, and when formed as the back electrode for a super straight-type solar cell, is able to suppress any deterioration in the conversion efficiency of the solar cell.

Furthermore, the formed conductive coating is able to control particle growth caused by sintering of the metal nanoparticles, and when formed as the back electrode for a substrate-type solar cell, is able to form a favorable textured structure. Furthermore, by varying the type and quantity of any additives used in the composition, a coating can be obtained in which the surface roughness and shape of the textured structure have been controlled. The electrode composed of the conductive coating formed on the upper surface of the substrate preferably has an average surface roughness within a range from 10 to 100 nm. Provided the average surface roughness is within this range, the coating is suitable as the textured structure of the back electrode of a substrate-type solar cell. The formed conductive coating has a resistivity that is close to the resistivity of the metal itself that constitutes the metal nanoparticles contained within the composition. Furthermore, the conductive coating also has a reflectance that is close to the reflectance of the metal itself that constitutes the metal nanoparticles contained within the composition.

Furthermore, when the formed conductive coating is used as an electrode layer for an electronic paper, the bonding interface with the active layer can be smoothed, which prevents electric field concentration, and is ideal for an electronic paper.

In this manner, the method for forming an electrode according to the present invention is able to form an electrode via the simple steps of forming a film by applying the composition for electrode formation to a substrate using a wet coating method, and then calcining the substrate with the film formed thereon. In this manner, because a vacuum process is unnecessary during film formation, process constraints are minimal, and running costs associated with the production equipment can be reduced dramatically.

Next is a description of a super straight-type solar cell formed using the composition for electrode formation according to the present invention.

First, as shown in FIG. 1A, a transparent conductive film is formed on top of a substrate 11 using a sputtering method, vapor deposition method or spray pyrolysis method (for example, a pyrolytic method using a fine spray of a tin chloride solution: nesa glass), thus forming a transparent electrode 12. Examples of the substrate 11 include transparent substrates such as glass. In order to enable this transparent conductive film to achieve light scattering and an optical confinement effect, a textured structure 12a is formed on the surface of the film. Nesa glass (an $SnO_2$-based glass) is typically used as the material for the transparent conductive film.

Figure 1B:
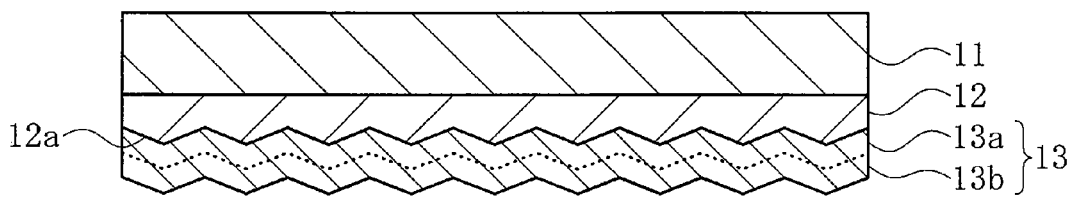
FIG. 1B is a cross-sectional view illustrating the production method for the same embodiment.

Subsequently, as shown in FIG. 1B, a photovoltaic layer 13 is formed on top of the transparent electrode 12 having the textured structure 12a. This photovoltaic layer 13 is formed using a plasma CVD method. The textured structure 12a of the transparent electrode 12 is reflected in the shape of the photovoltaic layer 13. In the present embodiment, the photovoltaic layer 13 is a PIN-junction stacked film composed of an amorphous silicon 13a and a microcrystalline silicon 13b, but a layer formed solely from the amorphous silicon 13a or a layer formed solely from the microcrystalline silicon 13b may also be used. A solar cell in which the photovoltaic layer 13 is formed from a PIN-junction stacked film composed of an amorphous silicon 13a and a microcrystalline silicon 13b is known as a hybrid or tandem solar cell.

Figure 1C:
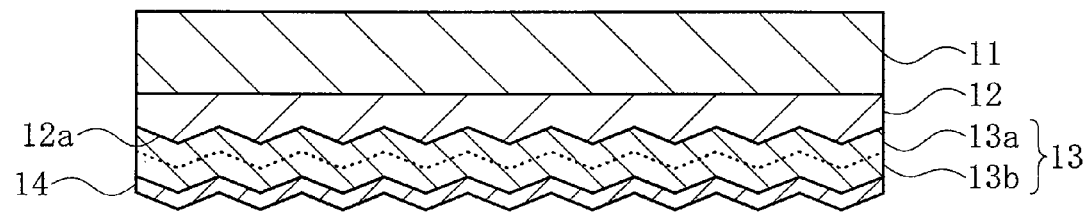
FIG. 1C is a cross-sectional view illustrating the production method for the same embodiment.

Next, as shown in FIG. 1C, in order to achieve surface passivation of the photovoltaic layer, ohmic contact with a back electrode 15, and an optical design having increased reflectance, a transparent conductive film 14 is formed on top of the photovoltaic layer 13 using a sputtering method, vapor deposition method or MOCVD method.

Figure 1D:
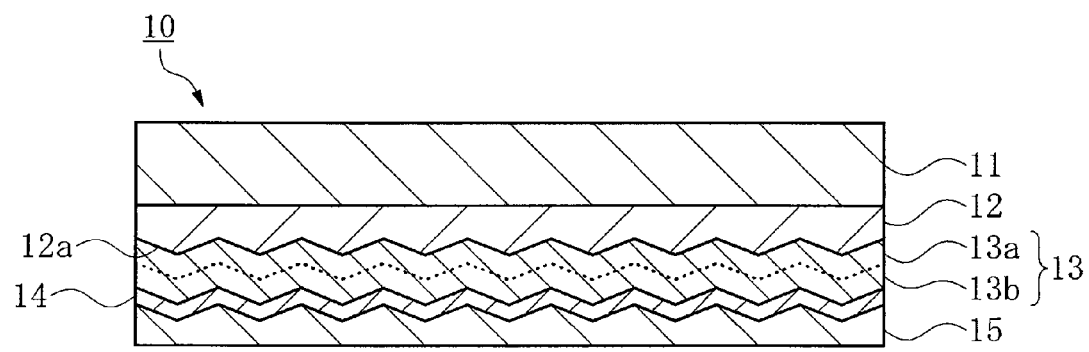
FIG. 1D is a cross-sectional view illustrating the production method for the same embodiment.

Finally, as shown in FIG. 1D, the composition for electrode formation according to the present invention is coated onto the transparent conductive film 14 and then calcined, thus forming a back electrode 15, and completing a super straight-type solar cell 10 in which light enters from the side of the transparent substrate. In this super straight-type solar cell 10, the substrate 11 acts as the light receiving surface. The formed back electrode 15 exhibits excellent adhesion to the transparent conductive film 14, and forms no spaces such as a fine air layer at the bonding interface with the transparent conductive film 14, meaning a super straight-type solar cell can be obtained in which any reduction in the conversion efficiency is suppressed.

Next is a description of a substrate-type solar cell formed using the composition for electrode formation according to the present invention.

Figure 2A:
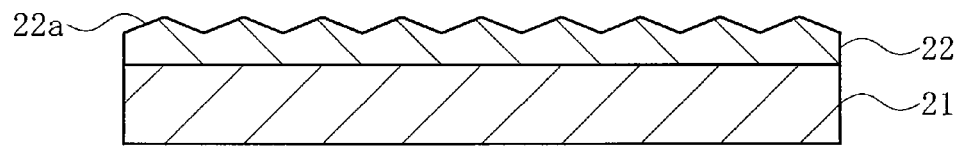
FIG. 2A is a cross-sectional view illustrating an embodiment of a production process for a substrate-type solar cell according to the present invention.

First, as shown in FIG. 2A, the composition for electrode formation according to the present invention is coated onto a substrate 21 and then calcined, thus forming a back electrode 22. Examples of the substrate 21 include glass and organic films and the like. The formed back electrode 22 has an effect of suppressing particle growth caused by sintering of the metal nanoparticles, and therefore a textured structure 22a that can achieve effective light scattering and an optical confinement effect can be formed on the surface of the back electrode 22.

Figure 2B:
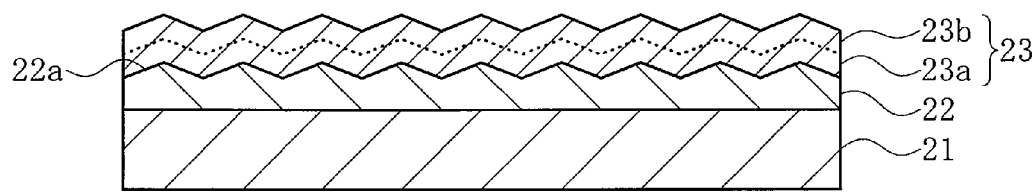
FIG. 2B is a cross-sectional view illustrating the production method for the same embodiment.

Subsequently, as shown in FIG. 2B, a photovoltaic layer 23 is formed on top of the back electrode 22 having the textured structure 22a. As was described for the photovoltaic layer 13 of the super straight-type solar cell, this photovoltaic layer 23 is formed using a CVD method, and reflects the shape of the textured structure 22a of the back electrode 22.

Figure 2C:
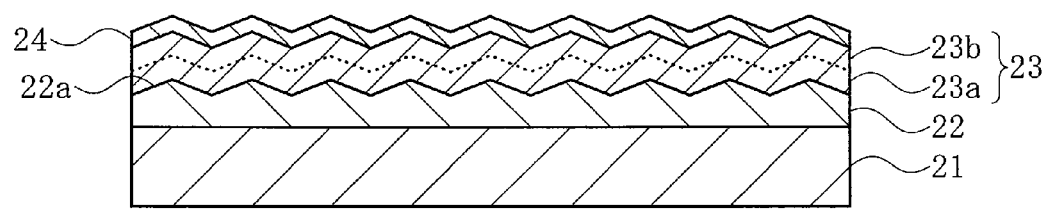
FIG. 2C is a cross-sectional view illustrating the production method for the same embodiment.

Next, as shown in FIG. 2C, a transparent conductive film is formed using a sputtering method, vapor deposition method or spray pyrolysis method, thus forming a transparent electrode 24. Nesa glass (an $SnO_2$-based glass) is typically used as the material for the transparent conductive film.

Figure 2D:
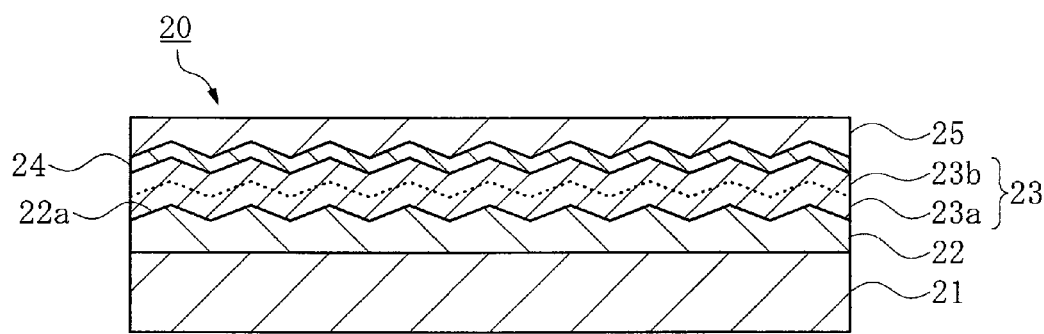
FIG. 2D is a cross-sectional view illustrating the production method for the same embodiment.

Finally, as shown in FIG. 2D, a sealant is formed on top of the transparent electrode 24, thus completing a substrate-type solar cell 20. In this substrate-type solar cell 20, the sealant acts as the light receiving surface.

A description of an electronic paper formed using the composition for electrode formation according to the present invention is presented below.

Figure 3:
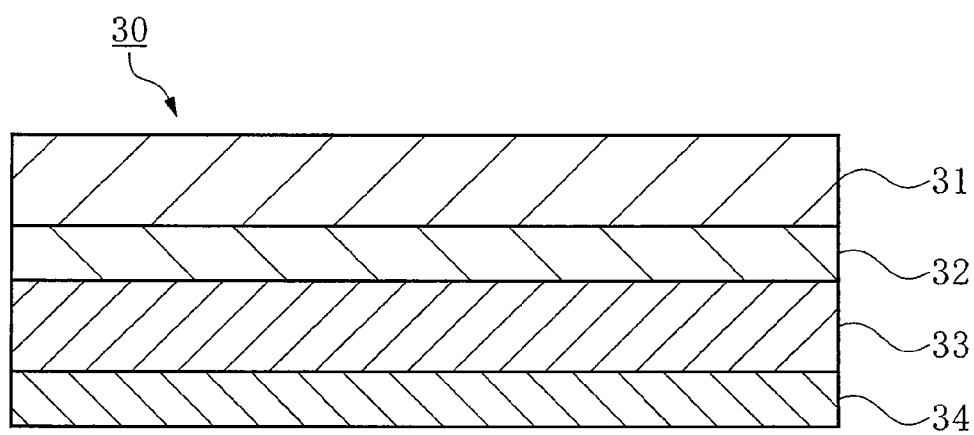
FIG. 3 is a cross-sectional view illustrating an electronic paper according to the present invention.

In this embodiment, as shown in FIG. 3, an electronic paper 30 has a structure in which an active layer 33 is formed on a substrate 31 with a transparent conductive film 32 disposed therebetween, and an electrode layer 34 is bonded to the interface of the active layer 33. Examples of the substrate 31 include glass, organic polymer films, plastic films, or organic polymer films having a silica thin film formed thereon. The transparent conductive film 32 is formed using a sputtering method. Examples of the material for the transparent conductive film include indium oxide-based films, tin oxide-based films and zinc oxide-based films. Examples of indium oxide-based films include indium oxide, ITO and IZO. Examples of tin oxide-based films include nesa (tin oxide $SnO_2$), ATO and fluorine-doped tin oxide. Examples of zinc oxide-based films include zinc oxide, AZO (aluminum-doped zinc oxide) and gallium-doped zinc oxide. Various systems have been proposed for the active layer 33, including microcapsule electrophoresis systems, electronic powder systems, cholesteric liquid crystal systems, and organic EL systems. The electrode layer 34 is formed by applying and then calcining the composition for electrode formation according to the present invention. An electrode layer 34 formed in this manner is able to smooth the bonding interface with the active layer 33, which prevents electric field concentration and is ideal for an electronic paper.

EXAMPLES

A more detailed description of the present invention is provided below based on a series of examples and comparative examples.

Examples 1 to 7, Comparative Examples 1 to 3

First, a metal salt aqueous solution having a concentration of 25% by weight was prepared by dissolving silver nitrate in deionized water. On the other hand, a sodium citrate aqueous solution having a concentration of 26% by weight was prepared by dissolving sodium citrate in deionized water. A particulate ferrous sulfate was then added directly to the sodium citrate aqueous solution within a stream of nitrogen gas held at 35° C., and the ferrous sulfate was dissolved to form an aqueous solution of a reducing agent containing citrate ions and ferrous ions in a molar ratio of 3:2.

Subsequently, with the above nitrogen gas stream maintained at 35° C., a magnetic stirrer bar was placed in the aqueous solution of the reducing agent, and the stirrer bar was rotated at a rotational speed of 100 rpm. With the aqueous solution of the reducing agent undergoing constant stirring, the above metal salt aqueous solution was added dropwise to the aqueous solution of the reducing agent. By adjusting the concentration levels of the two solutions so that the quantity added of the metal salt aqueous solution was not more than $\frac{1}{10}$th of the quantity of the aqueous solution of the reducing agent, the reaction temperature was able to be maintained at 40° C. even though the metal salt aqueous solution was added dropwise at room temperature. Furthermore, the mixing ratio of the aqueous solution of the reducing agent and the metal salt aqueous solution was adjusted so that the molar ratios of the citrate ions and ferrous ions within the aqueous solution of the reducing agent relative to the total atomic valence of metal ions within the metal salt aqueous solution was a 3-fold molar ratio in each case.

Following completion of the dropwise addition of the metal salt aqueous solution to the aqueous solution of the reducing agent, stirring of the mixed solution was continued for a further 15 minutes, thus generating metal particles within the mixed solution, and yielding a metal particle dispersion containing dispersed metal particles. The pH of the metal particle dispersion was 5.5, and the stoichiometric quantity of generated metal particles within the composition was 5 g/liter.

The thus obtained dispersion was left to stand at room temperature, thereby precipitating metal particles from the dispersion, and the formed aggregates of these precipitated metal particles were isolated by decantation. Deionized water was then added to the isolated metal aggregates to form a dispersion, a desalting treatment was conducted by ultrafiltration, and displacement washing was then conducted using methanol, thus forming a dispersion with a metal content of 50% by weight.

Subsequently, by using a centrifuge and regulating the centrifugal force applied by the centrifuge, the comparatively large particles having a particle size exceeding 100 nm were separated, enabling the preparation of metal nanoparticles that included a numerical average of 71% of metal nanoparticles having a primary particle size within a range from 10 to 50 nm. In other words, preparation was conducted so that the proportion of metal nanoparticles having a primary particle size within a range from 10 to 50 nm, calculated as a numerical average relative to the total 100% of all the metal nanoparticles, was 71%. The resulting metal nanoparticles were composed of silver nanoparticles, and these silver nanoparticles had been chemically modified with a protective agent having an organic molecular main chain in which the carbon skeleton contains 3 carbon atoms.

Next, 10 parts by weight of the thus obtained metal nanoparticles were added to, and dispersed within, 90 parts by weight of a mixed solution containing water, ethanol and methanol. Subsequently, the additives shown below in Table 1 were added to the various dispersions in the quantities shown in Table 1, thus completing preparation of coating test compositions of examples 1 to 7 and comparative examples 1 to 3.

Example 8

Using the same procedure as examples 1 to 7, silver nanoparticles were prepared so as to contain a numerical average of 71% of silver nanoparticles having a primary particle size within a range from 10 to 50 nm. In other words, a first dispersion was obtained by using a centrifuge to ensure that the proportion of silver nanoparticles having a primary particle size within a range from 10 to 50 nm, calculated as a numerical average relative to the total 100% by weight of all the silver nanoparticles, was 71%. In a separate preparation, with the exception of replacing the silver nitrate from example 1 with palladium nitrate, preparation was conducted using the same procedure as examples 1 to 7, so that following displacement washing with ethanol, the dispersion contained palladium nanoparticles that included a numerical average of 71% of palladium nanoparticles having a primary particle size within a range from 10 to 50 nm. In other words, a second dispersion was obtained by using a centrifuge to ensure that the proportion of palladium nanoparticles having a primary particle size within a range from 10 to 50 nm, calculated as a numerical average relative to the total 100% by weight of all the palladium nanoparticles, was 71%. 77% by weight of the first dispersion and 23% by weight of the second dispersion were then mixed. This dispersion was used for example 8, and was subjected to the same evaluations as examples 1 to 7. Next, 10 parts by weight of the thus obtained metal nanoparticles were added to, and dispersed within, 90 parts by weight of a mixed solution containing water, ethanol and methanol. Subsequently, as shown below in Table 1, PVP was added to the dispersion in the proportion of 10.0% by weight shown in Table 1. The silver nanoparticles and palladium nanoparticles within this dispersion had both been chemically modified with a protective agent having an organic molecular main chain in which the carbon skeleton contains 3 carbon atoms. Moreover, the protective agent that chemically modified the silver nanoparticles and the palladium nanoparticles had a hydroxyl group and a carbonyl group.

Example 9

Using the same procedure as examples 1 to 7, silver nanoparticles were prepared so as to contain a numerical average of 71% of silver nanoparticles having a primary particle size within a range from 10 to 50 nm. In other words, a first dispersion was obtained by using a centrifuge to ensure that the proportion of silver nanoparticles having a primary particle size within a range from 10 to 50 nm, calculated as a numerical average relative to the total 100% by weight of all the silver nanoparticles, was 71%. In a separate preparation, with the exception of replacing the silver nitrate from example 1 with ruthenium trichloride, preparation was conducted using the same procedure as examples 1 to 7, so that following displacement washing with ethanol, the dispersion contained ruthenium nanoparticles that included a numerical average of 71% of ruthenium nanoparticles having a primary particle size within a range from 10 to 50 nm. In other words, a second dispersion was obtained by using a centrifuge to ensure that the proportion of ruthenium nanoparticles having a primary particle size within a range from 10 to 50 nm, calculated as a numerical average relative to the total 100% by weight of all the ruthenium nanoparticles, was 72%. 77% by weight of the first dispersion and 23% by weight of the second dispersion were then mixed. This dispersion was used for example 9, and was subjected to the same evaluations as examples 1 to 7. Next, 10 parts by weight of the thus obtained metal nanoparticles were added to, and dispersed within, 90 parts by weight of a mixed solution containing water, ethanol and methanol. Subsequently, as shown below in Table 1, PVP was added to the dispersion in the proportion of 10.0% by weight shown in Table 1. The silver nanoparticles and ruthenium nanoparticles within this dispersion had both been chemically modified with a protective agent having an organic molecular main chain in which the carbon skeleton contains 3 carbon atoms. Moreover, the protective agent that chemically modified the silver nanoparticles and the ruthenium nanoparticles had a hydroxyl group and a carbonyl group.

<Comparative Test 1>

The coating test compositions obtained in examples 1 to 9 and comparative examples 1 to 3 were each applied to a substrate shown below in Table 1, by either spin coating or spray coating, to form a coating with a film thickness of 600 nm. Subsequently, the coating was calcined in the open atmosphere under the heat treatment conditions shown in Table 1, thus forming a conductive coating on the substrate. The thus formed conductive coating was evaluated for adhesion to the substrate and reflectance of the coating. The resistivity of the formed conductive was also determined.

Figure 4:
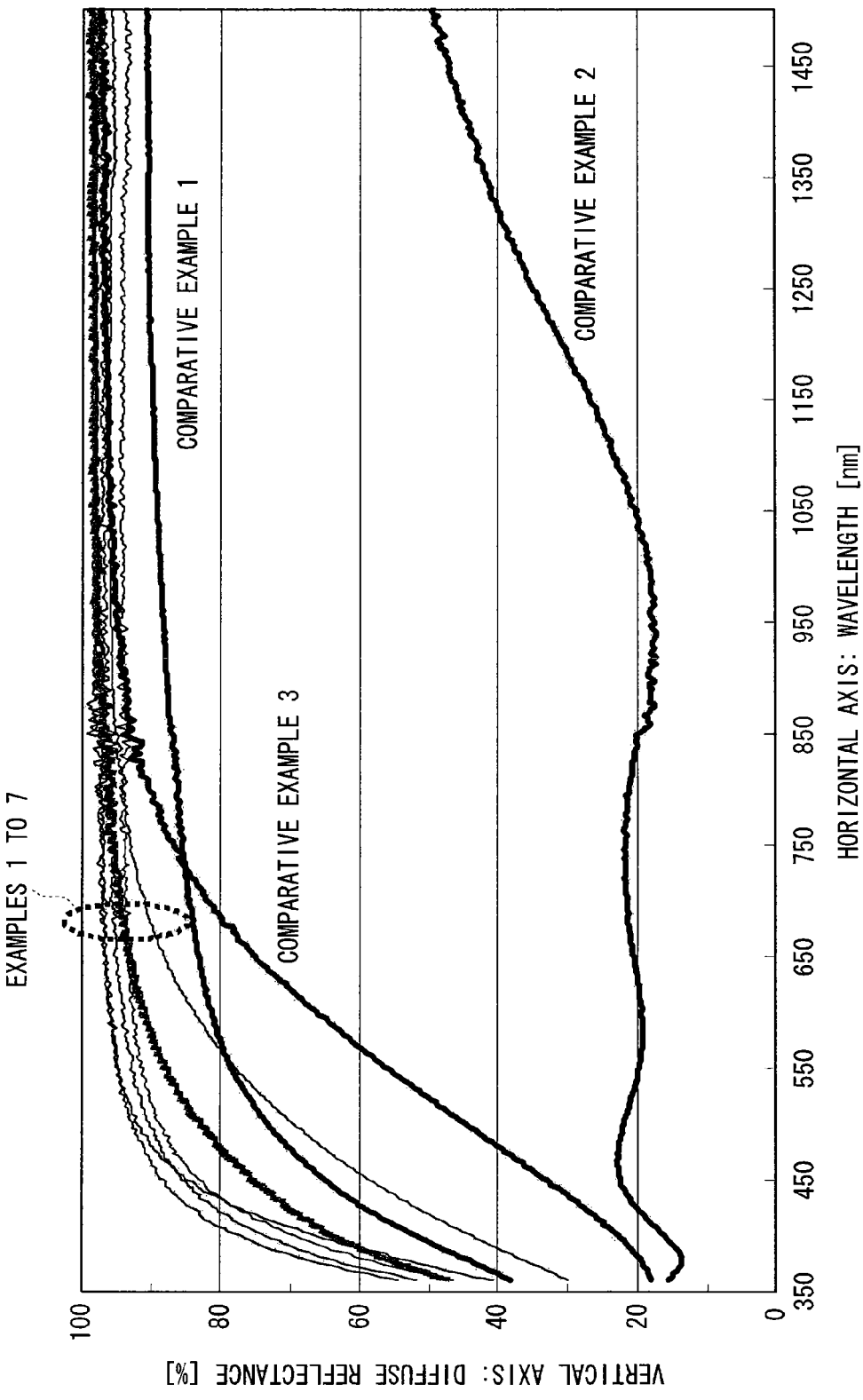
FIG. 4 is a graph illustrating the diffuse reflectance for coatings obtained in examples 1 to 7 and comparative examples 1 to 3.
Figure 5:
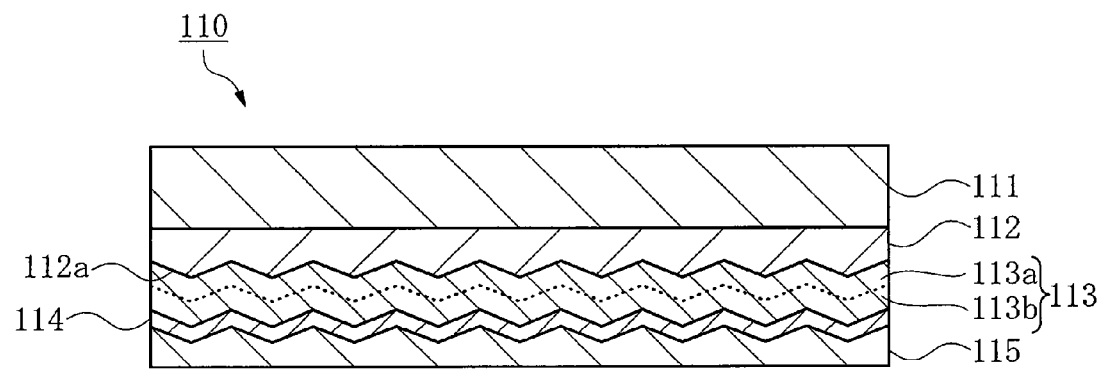
FIG. 5 is a cross-sectional view illustrating a conventional super straight-type solar cell.
Figure 6:
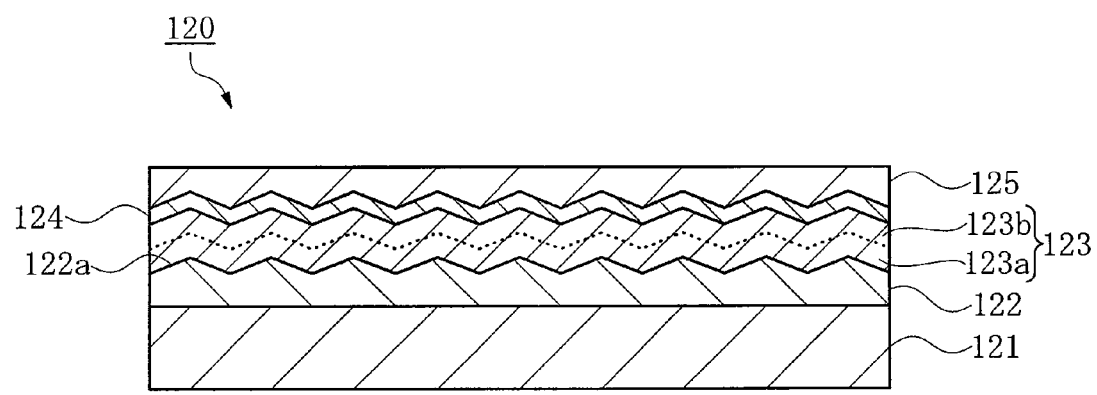
FIG. 6 is a cross-sectional view illustrating a conventional substrate-type solar cell.
Figure 7:
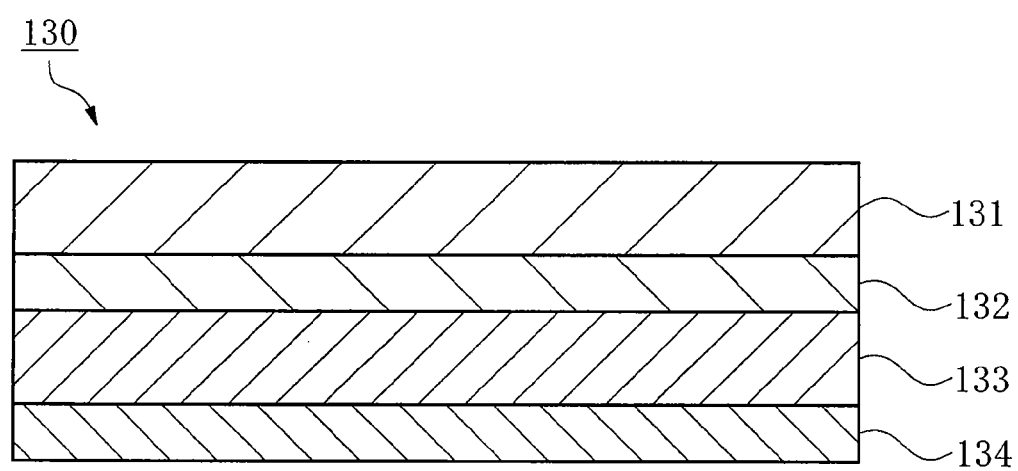
FIG. 7 is a cross-sectional view illustrating a conventional electronic paper.

Evaluation of the adhesion to the substrate was conducted using the method prescribed in JIS K 5600-5-6 (the cross-cut method), and was evaluated qualitatively. Specifically, those coatings for which no marked peeling of the coating occurred (namely, cases where the number of peeled squares was within a range from 0 to 2) were evaluated as "good", and all other cases were evaluated as "poor". Evaluation of the reflectance of the coating was conducted by measuring the diffuse reflectance of the coating using a combination of an ultraviolet-visible spectrophotometer and an integrating sphere. The results of the measurements are shown in FIG. 4. Further, a relative evaluation was also performed based on these measurement results. Specifically, using the diffuse reflectance of comparative example 1, which contained no additives within the coating test composition, as a reference value, coatings for which the diffuse reflectance exceeded this reference value were evaluated as "good", coatings for which the diffuse reflectance was substantially the same as the reference value were evaluated as "fair", and coatings for which the diffuse reflectance was worse than the reference value were evaluated as "poor". The resistivity of the coating was determined by measuring the surface resistance of the coating using a four probe method, measuring the film thickness of the coating using a scanning electron microscope (SEM), and then calculating the resistivity from these measured values for the surface resistance and the film thickness. The results are shown in Table 1.

TABLE 1

| | Metal nanoparticles | Additive Type | Quantity [% by weight] | Substrate | Heat treatment conditions | Adhesion | Reflectance | Resistivity [Ω·cm] |
|---|---|---|---|---|---|---|---|---|
| Example 1 | Silver nanoparticles | PVP | 10.0 | Polyimide | 200° C. × 20 minutes | Good | Good | $3 \times 10^{-6}$ |
| Example 2 | Silver nanoparticles | PVP-methacrylate copolymer | 0.2 | Glass | 230° C. × 20 minutes | Good | Good | $6 \times 10^{-6}$ |
| Example 3 | Silver nanoparticles | PVP-methacrylate copolymer | 0.5 | Polyimide | 230° C. × 20 minutes | Good | Good | $6 \times 10^{-6}$ |
| Example 4 | Silver nanoparticles | PVP-methacrylate copolymer | 1.0 | Aluminum | 230° C. × 20 minutes | Good | Good | $9 \times 10^{-6}$ |
| Example 5 | Silver nanoparticles | Methyl cellulose | 0.5 | ITO | 230° C. × 20 minutes | Good | Good | $4 \times 10^{-6}$ |
| Example 6 | Silver nanoparticles | Hydroxypropyl methylcellulose | 10.0 | ITO | 230° C. × 20 minutes | Good | Good | $6 \times 10^{-6}$ |
| Example 7 | Silver nanoparticles | Hydroxypropyl methylcellulose | 20.0 | ITO | 230° C. × 20 minutes | Good | Good | $8 \times 10^{-6}$ |
| Example 8 | Silver nanoparticles Palladium nanoparticles | PVP | 10.0 | Polyimide | 200° C. × 20 minutes | Good | Fair | $9 \times 10^{-6}$ |
| Example 9 | Silver nanoparticles Ruthenium nanoparticles | PVP | 10.0 | Polyimide | 200° C. × 20 minutes | Good | Fair | $8 \times 10^{-6}$ |
| Comparative example 1 | Silver nanoparticles | None | — | Soda glass | 200° C. × 20 minutes | Poor | Reference value | $3 \times 10^{-6}$ |
| Comparative example 2 | Silver nanoparticles | Urethane-based emulsion resin | 1.0 | Soda glass | 200° C. × 20 minutes | Good | Poor | $5 \times 10^{-5}$ |
| Comparative example 3 | Silver nanoparticles | Water-soluble acrylic polymer resin | 1.0 | Soda glass | 200° C. × 20 minutes | Good | poor | $4 \times 10^{-5}$ |

As is evident from FIG. 4, compared with comparative example 1 that contained no additives within the composition, and the comparative examples 2 and 3 that contained an added urethane resin or acrylic resin respectively within the composition, examples 1 to 7 in which a PVP, PVP copolymer or cellulose ether had been added to the composition of the present invention exhibited a higher diffuse reflectance at all of the measured wavelengths.

As is evident from Table 1, for comparative example 1 that contained no additives within the composition, the adhesion to the substrate was "poor", indicating an inferior result. Further, for the comparative examples 2 and 3 that contained an added urethane resin or acrylic resin respectively within the composition, although excellent results were obtained for the adhesion to the substrate and the coating resistivity, the reflectance of the coating was poor.

On the other hand, for examples 1 to 9 in which a PVP, PVP copolymer or cellulose ether had been added to the composition, the composition exhibited excellent adhesion to the substrate regardless of the variety of substrate used. Furthermore, for examples 1 to 7, excellent reflectance was obtained, and for examples 8 and 9, fair reflectance substantially equal to the reference value was obtained, indicating that depending on the variety of the additive, the addition of certain additives to the composition caused no deterioration in the reflectance. Moreover, a resistivity that was close to the resistivity of metallic silver was obtained, confirming that the coatings formed using a composition of the present invention exhibited excellent conductivity.

Coatings having these types of properties are ideal for use as a solar cell electrode.

Examples 10 to 21, Comparative Example 4

First, a metal salt aqueous solution was prepared by dissolving a metal salt for forming the metal nanoparticles shown below in Table 2 in deionized water. On the other hand, a sodium citrate aqueous solution having a concentration of 26% by weight was prepared by dissolving sodium citrate in deionized water. A particulate ferrous sulfate was then added directly to the sodium citrate aqueous solution within a stream of nitrogen gas held at 35° C., and the ferrous sulfate was dissolved to form an aqueous solution of a reducing agent containing citrate ions and ferrous ions in a molar ratio of 3:2.

Subsequently, with the above nitrogen gas stream maintained at 35° C., a magnetic stirrer bar was placed in the aqueous solution of the reducing agent, and the stirrer bar was rotated at a rotational speed of 100 rpm. With the aqueous solution of the reducing agent undergoing constant stirring, the above metal salt aqueous solution was added dropwise to the aqueous solution of the reducing agent. By adjusting the concentration levels of the two solutions so that the quantity added of the metal salt aqueous solution was not more than 1/10th of the quantity of the aqueous solution of the reducing agent, the reaction temperature was able to be maintained at 40° C. even though the metal salt aqueous solution was added dropwise at room temperature. Furthermore, the mixing ratio of the aqueous solution of the reducing agent and the metal salt aqueous solution was adjusted so that the molar ratios of the citrate ions and ferrous ions within the aqueous solution of the reducing agent relative to the total atomic valence of metal ions within the metal salt aqueous solution was a 3-fold molar ratio in each case. Following completion of the dropwise addition of the metal salt aqueous solution to the aqueous solution of the reducing agent, stirring of the mixed solution was continued for a further 15 minutes, thus generating metal particles within the mixed solution, and yielding a metal particle dispersion containing dispersed metal particles. The pH of the metal particle dispersion was 5.5, and the stoichiometric quantity of generated metal particles within the composition was 5 g/liter.

The thus obtained dispersion was left to stand at room temperature, thereby precipitating metal particles from the dispersion, and the formed aggregates of these precipitated metal particles were isolated by decantation. Deionized water was then added to the isolated metal aggregates to form a dispersion, a desalting treatment was conducted by ultrafiltration, and displacement washing was then conducted using methanol, thus forming a dispersion with a metal content of 50% by weight. Subsequently, by using a centrifuge and regulating the centrifugal force applied by the centrifuge, the comparatively large particles having a particle size exceeding 100 nm were separated, enabling the preparation of metal nanoparticles that included a numerical average of 71% of metal nanoparticles having a primary particle size within a range from 10 to 50 nm. In other words, preparation was conducted so that the proportion of metal nanoparticles having a primary particle size within a range from 10 to 50 nm, calculated as a numerical average relative to the total 100% of all the metal nanoparticles, was 71%. The resulting metal nanoparticles had been chemically modified with a protective agent having an organic molecular main chain in which the carbon skeleton contains 3 carbon atoms.

Next, 10 parts by weight of the thus obtained metal nanoparticles were added to, and dispersed within, 90 parts by weight of a mixed solution containing water, ethanol and methanol. Subsequently, the additives shown below in Table 2 were added to the various dispersions in the quantities shown in Table 2, thus completing preparation of coating test compositions of examples 10 to 21 and comparative example 4.

<Comparative Test 2>

The coating test compositions obtained in examples 10 to 21 and comparative example 4 were each applied to a substrate shown below in Table 2, using any of a variety of different film formation methods, so as to form a film thickness of $10^2$ to $2 \times 10^3$ nm. Subsequently, the coating was calcined under the heat treatment conditions shown in Table 2, thus forming a conductive coating on the substrate.

The resistivity, reflectance, coating thickness and average surface roughness were determined for each of the formed conductive coatings. The resistivity of the coating was determined by measuring the surface resistance of the coating using a four probe method, measuring the film thickness of the coating using a SEM, and then calculating the resistivity from these measured values for the surface resistance and the film thickness. Evaluation of the reflectance of the coating was conducted by measuring the diffuse reflectance of the coating at 800 nm using a combination of an ultraviolet-visible spectrophotometer and an integrating sphere. The coating thickness was measured by inspection of a cross-section of the coating using a SEM. The average surface roughness was obtained by determining evaluation values for the surface shape of the coating obtained using an atomic force microscope (AFM), and then evaluating these values in accordance with JIS B0601. The results are shown in Table 3.

TABLE 2

| | Metal nanoparticles | Additive | Film formation method | Substrate | Heat treatment Temperature [° C.] | Time [minutes] | Atmosphere |
|---|---|---|---|---|---|---|---|
| Example 10 | Ag 95 wt % | PVP (Mw 360,000) 5 wt % | Spray coating | Si | 200 | 20 | Open atmosphere |
| Example 11 | Ag 97 wt % | PVP (Mw 360,000) 2 wt % PVA (Mw 16,000) 1 wt % | Spray coating | Al | 200 | 20 | Open atmosphere |
| Example 12 | Ag 90 wt % Au 5 wt % | PVP-dimethylaminoethyl 5 wt % methacrylate | Spray coating | ITO | 200 | 20 | Open atmosphere |
| Example 13 | Ag 73 wt % Pd 24 wt % | Methylcellulose 3 wt % | Spray coating | ITO | 200 | 20 | Open atmosphere |
| Example 14 | Ag 95 wt % Ru 2 wt % | Hydroxypropyl 3 wt % methylcellulose | Spray coating | PZT | 200 | 20 | Open atmosphere |
| Example 15 | Ag 92 wt % Cu 5 wt % | PVP (Mw 360,000) 2 wt % PVA (Mw 16,000) 1 wt % | Dispenser coating | PET | 130 | 20 | $N_2$ |

TABLE 2-continued

| | Metal nanoparticles | Additive | Film formation method | Substrate | Heat treatment Temperature [° C.] | Time [minutes] | Atmosphere |
|---|---|---|---|---|---|---|---|
| Example 16 | Ag 96.8 wt % Sn 0.2 wt % | PVP (Mw 360,000) 2 wt % PVA (Mw 16,000) 1 wt % | Dispenser coating | PET | 130 | 20 | Open atmosphere |
| Example 17 | Ag 96.8 wt % In 0.2 wt % | PVP (Mw 360,000) 2 wt % PVA (Mw 16,000) 1 wt % | Dispenser coating | PET | 130 | 20 | Open atmosphere |
| Example 18 | Ag 96.8 wt % Zn 0.2 wt % | PVP (Mw 360,000) 2 wt % PVA (Mw 16,000) 1 wt % | Offset printing | Polyimide | 320 | 20 | Open atmosphere |
| Example 19 | Ag 96.8 wt % Fe 0.2 wt % | PVP (Mw 360,000) 2 wt % PVA (Mw 16,000) 1 wt % | Offset printing | Polyimide | 320 | 20 | Open atmosphere |
| Example 20 | Ag 96.8 wt % Cr 0.2 wt % | PVP (Mw 360,000) 2 wt % PVA (Mw 16,000) 1 wt % | Screen printing | Polyimide | 320 | 20 | Open atmosphere |
| Example 21 | Ag 96.8 wt % Mn 0.2 wt % | PVP (Mw 360,000) 2 wt % PVA (Mw 16,000) 1 wt % | Screen printing | Polyimide | 320 | 20 | Open atmosphere |
| Comparative example 4 | Ag 100 wt % | None | Spray coating | Polyimide | 200 | 20 | Open atmosphere |

TABLE 3

| | Resistivity [Ω · cm] | Reflectance (800 nm) [% R] | Coating thickness [nm] | Average surface roughness [nm] |
|---|---|---|---|---|
| Example 10 | $3.1 \times 10^{-6}$ | 95 | $1.0 \times 10^2$ | 10 |
| Example 11 | $3.5 \times 10^{-6}$ | 95 | $5.0 \times 10^2$ | 30 |
| Example 12 | $5.1 \times 10^{-6}$ | 90 | $1.0 \times 10^3$ | 15 |
| Example 13 | $8.2 \times 10^{-6}$ | 92 | $1.1 \times 10^3$ | 40 |
| Example 14 | $6.7 \times 10^{-6}$ | 92 | $1.0 \times 10^3$ | 30 |
| Example 15 | $4.5 \times 10^{-6}$ | 94 | $1.2 \times 10^3$ | 40 |
| Example 16 | $3.2 \times 10^{-6}$ | 94 | $1.0 \times 10^3$ | 40 |
| Example 17 | $3.7 \times 10^{-6}$ | 94 | $1.0 \times 10^3$ | 40 |
| Example 18 | $3.2 \times 10^{-6}$ | 93 | $1.9 \times 10^3$ | 30 |
| Example 19 | $3.5 \times 10^{-6}$ | 94 | $1.8 \times 10^3$ | 30 |
| Example 20 | $3.6 \times 10^{-6}$ | 94 | $2.0 \times 10^3$ | 20 |
| Example 21 | $3.4 \times 10^{-6}$ | 92 | $2.0 \times 10^3$ | 15 |
| Comparative example 4 | $2.5 \times 10^{-6}$ | 94 | $1.0 \times 10^2$ | 110 |

As is evident from Table 3, comparison of the conductive coatings formed using the compositions of examples 10 to 21 with the conductive coating formed using the composition of comparative example 4 revealed that the resistivity and the reflectance were substantially equal. However, the average surface roughness for the coating of comparative example 4 was 110 nm, whereas the average surface roughness for the coatings of examples 10 to 21 were all within a range from 10 to 40 nm, confirming that the surface roughness was within the preferred range for the textured structure of a back electrode of a substrate-type solar cell.

Examples 22 to 58, Comparative Examples 5 to 8

First, a metal salt aqueous solution was prepared by dissolving a metal salt for forming the metal nanoparticles shown below in Tables 4 to 6 in deionized water. On the other hand, a sodium citrate aqueous solution having a concentration of 26% by weight was prepared by dissolving sodium citrate in deionized water. A particulate ferrous sulfate was then added directly to the sodium citrate aqueous solution within a stream of nitrogen gas held at 35° C., and the ferrous sulfate was dissolved to form an aqueous solution of a reducing agent containing citrate ions and ferrous ions in a molar ratio of 3:2.

Subsequently, with the above nitrogen gas stream maintained at 35° C., a magnetic stirrer bar was placed in the aqueous solution of the reducing agent, and the stirrer bar was rotated at a rotational speed of 100 rpm. With the aqueous solution of the reducing agent undergoing constant stirring, the above metal salt aqueous solution was added dropwise to the aqueous solution of the reducing agent. By adjusting the concentration levels of the two solutions so that the quantity added of the metal salt aqueous solution was not more than 1/10th of the quantity of the aqueous solution of the reducing agent, the reaction temperature was able to be maintained at 40° C. even though the metal salt aqueous solution was added dropwise at room temperature. Furthermore, the mixing ratio of the aqueous solution of the reducing agent and the metal salt aqueous solution was adjusted so that the molar ratios of the citrate ions and ferrous ions within the aqueous solution of the reducing agent relative to the total atomic valence of metal ions within the metal salt aqueous solution was a 3-fold molar ratio in each case. Following completion of the dropwise addition of the metal salt aqueous solution to the aqueous solution of the reducing agent, stirring of the mixed solution was continued for a further 15 minutes, thus generating metal particles within the mixed solution, and yielding a metal particle dispersion containing dispersed metal particles. The pH of the metal particle dispersion was 5.5, and the stoichiometric quantity of generated metal particles within the composition was 5 g/liter.

The thus obtained dispersion was left to stand at room temperature, thereby precipitating metal particles from the dispersion, and the formed aggregates of these precipitated metal particles were isolated by decantation. Deionized water was then added to the isolated metal aggregates to form a dispersion, a desalting treatment was conducted by ultrafiltration, and displacement washing was then conducted using methanol, thus forming a dispersion with a metal content of 50% by weight. Subsequently, by using a centrifuge and regulating the centrifugal force applied by the centrifuge, the comparatively large particles having a particle size exceeding 100 nm were separated, enabling the preparation of metal nanoparticles that included a numerical average of 71% of metal nanoparticles having a primary particle size within a range from 10 to 50 nm. In other words, preparation was conducted so that the proportion of metal nanoparticles having a primary particle size within a range from 10 to 50 nm, calculated as a numerical average relative to the total 100% of all the metal nanoparticles, was 71%. The resulting metal nanoparticles had been chemically modified with a protective agent having an organic molecular main chain in which the carbon skeleton contains 3 carbon atoms.

Next, 10 parts by weight of the thus obtained metal nanoparticles were added to, and dispersed within, 90 parts by weight of a mixed solution containing water, ethanol and methanol. Subsequently, the additives shown below in Tables 4 to 6 were added to the various dispersions in the quantities shown in Tables 4 to 6, thus completing preparation of coating test compositions of examples 22 to 58 and comparative examples 5 to 8.

<Comparative Test 3>

The coating test compositions obtained in examples 22 to 58 and comparative example 5 to 8 were each applied to a substrate shown below in Tables 4 to 6, using any of a variety of different film formation methods, so as to form a film thickness of $10^2$ to $2 \times 10^3$ nm. Subsequently, the coating was calcined under the heat treatment conditions shown in Tables 4 to 6, thus forming a conductive coating on the substrate.

For each of the formed conductive coatings, the adhesion to the substrate was evaluated, and the resistivity, reflectance, coating thickness and average surface roughness were determined Evaluation of the adhesion to the substrate was conducted using the method prescribed in JIS K 5600-5-6 (the cross-cut method), and was evaluated qualitatively. Specifically, those coatings for which no marked peeling of the coating occurred (namely, cases where the number of peeled squares was within a range from 0 to 2) were evaluated as "good", and all other cases were evaluated as "poor". The resistivity of the coating was determined by measuring the surface resistance of the coating using a four probe method, measuring the film thickness of the coating using a SEM, and then calculating the resistivity from these measured values for the surface resistance and the film thickness. Evaluation of the reflectance of the coating was conducted by measuring the diffuse reflectance of the coating at 800 nm using a combination of an ultraviolet-visible spectrophotometer and an integrating sphere. The coating thickness was measured by inspection of a cross-section of the coating using a SEM. The average surface roughness was obtained by determining evaluation values for the surface shape of the coating obtained using an AFM, and then evaluating these values in accordance with JIS B0601. The results are shown in Tables 7 and 8.

TABLE 4

| | Metal nanoparticles | Additive | Film formation method | Substrate | Heat treatment Temperature [° C.] | Time [minutes] | Atmosphere |
|---|---|---|---|---|---|---|---|
| Example 22 | Ag 94 wt % | PVP (Mw 360,000) 5 wt % Nickel acetate 1 wt % | Spray coating | Si | 200 | 20 | Open atmosphere |
| Example 23 | Ag 96 wt % | PVP (Mw 360,000) 2 wt % PVA (Mw 16,000) 1 wt % Copper acetate 1 wt % | Spray coating | Al | 200 | 20 | Open atmosphere |
| Example 24 | Ag 89 wt % Au 5 wt % | PVP-dimethylaminoethyl 5 wt % methacrylate Zinc acetate 1 wt % | Spray coating | ITO | 200 | 20 | Open atmosphere |
| Example 25 | Ag 72 wt % Pd 24 wt % | Methylcellulose 3 wt % Molybdenum acetate 1 wt % | Spray coating | ITO | 200 | 20 | Open atmosphere |
| Example 26 | Ag 94 wt % Ru 2 wt % | Hydroxypropyl 3 wt % methylcellulose Tin acetate 1 wt % | Spray coating | PZT | 200 | 20 | Open atmosphere |
| Example 27 | Ag 91 wt % Cu 5 wt % | PVP (Mw 360,000) 2 wt % PVA (Mw 16,000) 1 wt % Tin acetate 1 wt % | Dispenser coating | PET | 130 | 20 | $N_2$ |
| Example 28 | Ag 95.8 wt % Sn 0.2 wt % | PVP (Mw 360,000) 2 wt % PVA (Mw 16,000) 1 wt % Tin acetate 1 wt % | Dispenser coating | PET | 130 | 20 | Open atmosphere |
| Example 29 | Ag 95.8 wt % In 0.2 wt % | PVP (Mw 360,000) 2 wt % PVA (Mw 16,000) 1 wt % Tin acetate 1 wt % | Dispenser coating | PET | 130 | 20 | Open atmosphere |
| Example 30 | Ag 95.8 wt % Zn 0.2 wt % | PVP (Mw 360,000) 2 wt % PVA (Mw 16,000) 1 wt % Tin acetate 1 wt % | Offset printing | Polyimide | 320 | 20 | Open atmosphere |
| Example 31 | Ag 95.8 wt % Fe 0.2 wt % | PVP (Mw 360,000) 2 wt % PVA (Mw 16,000) 1 wt % Zinc acetate 1 wt % | Offset printing | Polyimide | 320 | 20 | Open atmosphere |
| Example 32 | Ag 96.7 wt % Cr 0.2 wt % | PVP (Mw 360,000) 2 wt % PVA (Mw 16,000) 1 wt % Nickel acetate 0.1 wt % | Screen printing | Polyimide | 320 | 20 | Open atmosphere |
| Example 33 | Ag 96.7 wt % Mn 0.2 wt % | PVP (Mw 360,000) 2 wt % PVA (Mw 16,000) 1 wt % Nickel acetate 0.1 wt % | Screen printing | Polyimide | 320 | 20 | Open atmosphere |

TABLE 5

| | Metal nanoparticles | Additive | Film formation method | Substrate | Heat treatment Temperature [° C.] | Time [minutes] | Atmosphere |
|---|---|---|---|---|---|---|---|
| Example 34 | Ag 90 wt % | PVP (Mw 360,000) 9 wt % $Al_2O_3$ 1 wt % | Knife coating | Glass | 400 | 60 | Open atmosphere |
| Example 35 | Ag 99 wt % | PVP (Mw 360,000) 0.9 wt % $SiO_2$ 0.1 wt % | Slit coating | Glass | 400 | 60 | Open atmosphere |
| Example 36 | Ag 95 wt % | PVP (Mw 360,000) 4 wt % $TiO_2$ 1 wt % | Spin coating | Polyimide | 320 | 20 | Open atmosphere |

TABLE 5-continued

| | Metal nanoparticles | Additive | Film formation method | Substrate | Heat treatment Temperature [° C.] | Time [minutes] | Atmosphere |
|---|---|---|---|---|---|---|---|
| Example 37 | Ag 95 wt % | PVP (Mw 360,000) 4 wt % $Cr_2O_3$ 1 wt % | Spin coating | Polyimide | 320 | 20 | Open atmosphere |
| Example 38 | Ag 95 wt % | PVP (Mw 360,000) 4 wt % $MnO_2$ 1 wt % | Spin coating | Polyimide | 320 | 20 | Open atmosphere |
| Example 39 | Ag 95 wt % | PVP (Mw 360,000) 4 wt % $Fe_2O_3$ 0.5 wt % $Co_3O_4$ 0.5 wt % | Spin coating | Polyimide | 320 | 20 | Open atmosphere |
| Example 40 | Ag 95 wt % | PVP (Mw 360,000) 4 wt % $Ag_2O$ 1 wt % | Spin coating | Polyimide | 320 | 20 | Open atmosphere |
| Example 41 | Ag 95 wt % | PVP (Mw 360,000) 4 wt % $Cu(OH)_2$ 1 wt % | Spin coating | Polyimide | 320 | 20 | Ar |
| Example 42 | Ag 95 wt % | PVP (Mw 360,000) 4 wt % ZnO 1 wt % | Spin coating | Polyimide | 320 | 20 | Open atmosphere |
| Example 43 | Ag 95 wt % | PVP (Mw 360,000) 4 wt % $MoO_2$ 1 wt % | Spin coating | Polyimide | 320 | 20 | Open atmosphere |
| Example 44 | Ag 95 wt % | PVP (Mw 360,000) 4 wt % $SnO_2$ 1 wt % | Spin coating | Polyimide | 320 | 20 | Open atmosphere |
| Example 45 | Ag 95 wt % | PVP (Mw 360,000) 4 wt % ITO 1 wt % | Spin coating | Polyimide | 320 | 20 | Open atmosphere |
| Example 46 | Ag 95 wt % | PVP (Mw 360,000) 4 wt % ATO 1 wt % | Spin coating | Polyimide | 320 | 20 | Open atmosphere |
| Example 47 | Ag 95 wt % | PVP (Mw 360,000) 4 wt % Methyl silicate 1 wt % | Spin coating | Polyimide | 320 | 20 | Open atmosphere |
| Example 48 | Ag 95 wt % | PVP (Mw 360,000) 4 wt % Titanium isopropoxide 1 wt % | Spin coating | Polyimide | 320 | 20 | Open atmosphere |

TABLE 6

| | Metal nanoparticles | Additive | Film formation method | Substrate | Heat treatment Temperature [° C.] | Time [minutes] | Atmosphere |
|---|---|---|---|---|---|---|---|
| Example 49 | Ag 95 wt % | PVP (Mw 360,000) 4 wt % Chromium acetate 1 wt % | Spin coating | Polyimide | 320 | 20 | Open atmosphere |
| Example 50 | Ag 95.9 wt % | PVP (Mw 360,000) 4 wt % Manganese formate 0.1 wt % | Spin coating | Polyimide | 320 | 20 | Open atmosphere |
| Example 51 | Ag 95.9 wt % | PVP (Mw 360,000) 4 wt % Iron citrate 0.1 wt % | Spin coating | Polyimide | 320 | 20 | Open atmosphere |
| Example 52 | Ag 95.9 wt % | PVP (Mw 360,000) 4 wt % Cobalt formate 0.1 wt % | Spin coating | Polyimide | 320 | 20 | Open atmosphere |
| Example 53 | Ag 95 wt % | PVA (Mw 16,000) 4 wt % Nickel acetate 1 wt % | Spin coating | Polyimide | 320 | 20 | Open atmosphere |
| Example 54 | Ag 95 wt % | PVP (Mw 360,000) 4 wt % Silver citrate 1 wt % | Spin coating | Polyimide | 320 | 20 | Open atmosphere |
| Example 55 | Ag 95 wt % | PVA (Mw 16,000) 4 wt % Copper acetate 1 wt % | Spin coating | Polyimide | 320 | 20 | $N_2$ |
| Example 56 | Ag 95 wt % | PVA (Mw 16,000) 4 wt % Zinc acetate 1 wt % | Spin coating | Polyimide | 320 | 20 | Open atmosphere |
| Example 57 | Ag 95 wt % | PVA (Mw 16,000) 4 wt % Molybdenum acetate 1 wt % | Spin coating | Polyimide | 320 | 20 | Open atmosphere |
| Example 58 | Ag 95 wt % | PVA (Mw 16,000) 4 wt % Tin acetate 1 wt % | Spin coating | Polyimide | 320 | 20 | Open atmosphere |
| Comparative example 5 | Ag 100 wt % | None | Spray coating | Polyimide | 200 | 20 | Open atmosphere |
| Comparative example 6 | Ag 95 wt % Au 5 wt % | None | Spray coating | ITO | 200 | 20 | Open atmosphere |
| Comparative example 7 | Ag 95 wt % Cu 5 wt % | None | Dispenser coating | PET | 130 | 20 | $N_2$ |
| Comparative example 8 | Ag 99.8 wt % Mn 0.2 wt % | None | Screen printing | Polyimide | 320 | 20 | Open atmosphere |

TABLE 7

| | Adhesion | Resistivity [Ω·cm] | Reflectance (800 nm) [% R] | Coating thickness [nm] | Average surface roughness [nm] |
|---|---|---|---|---|---|
| Example 22 | Good | $3.1 \times 10^{-6}$ | 95 | $1.0 \times 10^2$ | 10 |
| Example 23 | Good | $3.5 \times 10^{-6}$ | 95 | $5.0 \times 10^2$ | 30 |
| Example 24 | Good | $5.1 \times 10^{-6}$ | 90 | $1.0 \times 10^3$ | 15 |

TABLE 7-continued

|  | Adhesion | Resistivity [Ω · cm] | Reflectance (800 nm) [% R] | Coating thickness [nm] | Average surface roughness [nm] |
|---|---|---|---|---|---|
| Example 25 | Good | $8.2 \times 10^{-6}$ | 92 | $1.1 \times 10^3$ | 40 |
| Example 26 | Good | $6.7 \times 10^{-6}$ | 92 | $1.0 \times 10^3$ | 30 |
| Example 27 | Good | $4.5 \times 10^{-6}$ | 94 | $1.2 \times 10^3$ | 40 |
| Example 28 | Good | $3.2 \times 10^{-6}$ | 94 | $1.0 \times 10^3$ | 40 |
| Example 29 | Good | $3.7 \times 10^{-6}$ | 94 | $1.0 \times 10^3$ | 40 |
| Example 30 | Good | $3.2 \times 10^{-6}$ | 93 | $1.9 \times 10^3$ | 30 |
| Example 31 | Good | $3.5 \times 10^{-6}$ | 94 | $1.8 \times 10^3$ | 30 |
| Example 32 | Good | $3.6 \times 10^{-6}$ | 94 | $2.0 \times 10^3$ | 20 |
| Example 33 | Good | $3.4 \times 10^{-6}$ | 92 | $2.0 \times 10^3$ | 15 |
| Example 34 | Good | $2.1 \times 10^{-6}$ | 88 | $2.0 \times 10^3$ | 90 |
| Example 35 | Good | $2.5 \times 10^{-6}$ | 86 | $1.9 \times 10^3$ | 100 |
| Example 36 | Good | $4.2 \times 10^{-6}$ | 83 | $1.0 \times 10^3$ | 70 |
| Example 37 | Good | $4.1 \times 10^{-6}$ | 85 | $1.1 \times 10^3$ | 90 |
| Example 38 | Good | $3.9 \times 10^{-6}$ | 88 | $1.0 \times 10^3$ | 80 |
| Example 39 | Good | $5.2 \times 10^{-6}$ | 82 | $1.2 \times 10^3$ | 90 |
| Example 40 | Good | $3.2 \times 10^{-6}$ | 94 | $1.2 \times 10^3$ | 30 |

TABLE 8

|  | Adhesion | Resistivity [Ω · cm] | Reflectance (800 nm) [% R] | Coating thickness [nm] | Average surface roughness [nm] |
|---|---|---|---|---|---|
| Example 41 | Good | $5.5 \times 10^{-6}$ | 80 | $1.0 \times 10^3$ | 50 |
| Example 42 | Good | $4.9 \times 10^{-6}$ | 85 | $1.0 \times 10^3$ | 60 |
| Example 43 | Good | $5.2 \times 10^{-6}$ | 81 | $1.0 \times 10^3$ | 50 |
| Example 44 | Good | $4.9 \times 10^{-6}$ | 82 | $1.0 \times 10^3$ | 70 |
| Example 45 | Good | $4.8 \times 10^{-6}$ | 85 | $1.1 \times 10^3$ | 80 |
| Example 46 | Good | $5.1 \times 10^{-6}$ | 84 | $1.0 \times 10^3$ | 70 |
| Example 47 | Good | $3.5 \times 10^{-6}$ | 85 | $1.1 \times 10^3$ | 60 |
| Example 48 | Good | $3.2 \times 10^{-6}$ | 82 | $1.0 \times 10^3$ | 60 |
| Example 49 | Good | $3.3 \times 10^{-6}$ | 80 | $1.1 \times 10^3$ | 70 |
| Example 50 | Good | $3.7 \times 10^{-6}$ | 88 | $1.0 \times 10^3$ | 70 |
| Example 51 | Good | $3.2 \times 10^{-6}$ | 90 | $1.0 \times 10^3$ | 50 |
| Example 52 | Good | $2.5 \times 10^{-6}$ | 91 | $1.2 \times 10^3$ | 30 |
| Example 53 | Good | $4.1 \times 10^{-6}$ | 86 | $1.1 \times 10^3$ | 50 |
| Example 54 | Good | $3.7 \times 10^{-6}$ | 88 | $1.0 \times 10^3$ | 40 |
| Example 55 | Good | $4.5 \times 10^{-6}$ | 85 | $1.0 \times 10^3$ | 60 |
| Example 56 | Good | $3.4 \times 10^{-6}$ | 82 | $1.0 \times 10^3$ | 50 |
| Example 57 | Good | $3.2 \times 10^{-6}$ | 83 | $1.1 \times 10^3$ | 70 |
| Example 58 | Good | $4.2 \times 10^{-6}$ | 84 | $1.0 \times 10^3$ | 50 |
| Comparative example 5 | Poor | $2.5 \times 10^{-6}$ | 94 | $1.0 \times 10^3$ | 110 |
| Comparative example 6 | Poor | $4.9 \times 10^{-6}$ | 89 | $1.0 \times 10^3$ | 105 |
| Comparative example 7 | Poor | $4.3 \times 10^{-6}$ | 92 | $1.2 \times 10^3$ | 110 |
| Comparative example 8 | Poor | $3.2 \times 10^{-6}$ | 89 | $2.0 \times 10^3$ | 110 |

As is evident from Table 8, for each of the comparative examples 5 to 8 in which the composition included no additives, the adhesion to the substrate was evaluated as "poor", a result indicating inferior adhesion. In contrast, as is evident from Tables 7 and 8, the conductive coatings formed using the compositions of examples 22 to 58 each exhibited good adhesion to the substrate. Furthermore, for examples 22 to 58, a resistivity was obtained that was close to the resistivity of the metal itself that constitutes the metal nanoparticles contained within the composition, confirming that a conductive coating formed using a composition of the present invention exhibits excellent conductivity. Furthermore, excellent reflectance was obtained that was close to the reflectance of the metal itself that constitutes the metal nanoparticles contained within the composition, and it was found that the reflectance did not decrease even upon the addition of additives. Moreover, the average surface roughness for each of the coatings was within a range from 10 to 100 nm, confirming that the surface roughness was within the preferred range for the textured structure of a back electrode of a substrate-type solar cell.

INDUSTRIAL APPLICABILITY

The present invention is able to provide a composition for electrode formation, a method for forming an electrode using the composition, an electrode for a solar cell and an electrode for an electronic paper electrode obtained using the method, and a solar cell and an electronic paper, and the invention is therefore extremely useful industrially.

The invention claimed is:
1. A composition for electrode formation, comprising:
a dispersion medium;
metal nanoparticles dispersed in the dispersion medium; and one or more organic polymers selected from the group consisting of polyvinylpyrrolidone copolymers and cellulose ethers, wherein, a quantity of the metal nanoparticles within the composition is in a range from 2.5 to 95.0% by weight relative to 100% by weight of a dispersion composed of the metal nanoparticles and the dispersion medium, the metal nanoparticles have been chemically modified with a protective agent having an organic molecular main chain in which a carbon skeleton contains from 1 to 3 carbon atoms, a coating formed by applying the composition to a substrate using a wet coating method, the substrate includes at least one of;
- a silicon, a glass, a ceramic containing transparent conductive material,
- a polymer material or a metal,
- a laminate composed of two or more materials selected from a group consisting of glass, ceramic containing transparent conductive material, polymer materials and metals, the protective agent is configured to be at least one of eliminated and decomposed by heat applied for calcining the coating at a temperature of 130 to 400° C., whereby organic materials having an adverse effect on an electrical conductivity are removed from the coating, and the calcined coating formed by the composition has a thickness within a range of 0.1 to 2.0 μm, a resistivity of $2.1 \times 10^{-6}$ to $8.2 \times 10^{-6}$ [Ω·cm] and a reflectance value of 80 to 95% at 800 nm.

2. The composition for electrode formation according to claim 1,
wherein a quantity of the organic polymer is within a range from 0.1 to 20% by weight of the metal nanoparticles.

3. The composition for electrode formation according to claim 1,
wherein the metal nanoparticles comprise 75% by weight or more of silver nanoparticles.

4. The composition for electrode formation according to claim 1,
wherein the metal nanoparticles comprise a numerical average of at least 70% of metal nanoparticles having a primary particle size within a range from 10 to 50 nm.

5. The composition for electrode formation according to claim 1,
wherein the metal nanoparticles comprise at least 75% by weight of silver nanoparticles, and also comprise particles composed of one metal, or a mixed composition or alloy composition of two or more metals, selected from the group consisting of gold, platinum, palladium, ruthenium, nickel, copper, tin, indium, zinc, iron, chromium and manganese,
and a quantity of particles other than the silver nanoparticles contained within the metal nanoparticles is at least 0.02% by weight but less than 25% by weight.

6. The composition for electrode formation according to claim 1,
wherein the dispersion medium is an alcohol or an alcohol-containing aqueous solution.

7. The composition for electrode formation according to claim 1,
further comprising one or more additives selected from the group consisting of metal oxides, metal hydroxides, organometallic compounds and silicone oils.

8. The composition for electrode formation according to claim 7,
wherein the metal oxide is an oxide or a composite oxide comprising at least one element selected from the group consisting of aluminum, silicon, titanium, chromium, manganese, iron, cobalt, nickel, silver, copper, zinc, molybdenum, tin, indium and antimony.

9. The composition for electrode formation according to claim 7,
wherein the metal hydroxide is a hydroxide comprising at least one element selected from the group consisting of aluminum, silicon, titanium, chromium, manganese, iron, cobalt, nickel, silver, copper, zinc, molybdenum, tin, indium and antimony.

10. The composition for electrode formation according to claim 7,
wherein the organometallic compound is a metal soap, a metal complex or a metal alkoxide of silicon, titanium, chromium, manganese, iron, cobalt, nickel, silver, copper, zinc, molybdenum or tin.

* * * * *